US012125715B2

United States Patent
Hsu et al.

(10) Patent No.: US 12,125,715 B2
(45) Date of Patent: *Oct. 22, 2024

(54) CHIP PACKAGE STRUCTURE WITH NICKEL LAYER

(71) Applicant: Taiwan Semiconductor Manufacturing Company, Ltd., Hsinchu (TW)

(72) Inventors: Kuo-Ching Hsu, Taipei (TW); Yu-Huan Chen, Taoyuan (TW); Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/341,052

(22) Filed: Jun. 26, 2023

(65) Prior Publication Data

US 2023/0335411 A1     Oct. 19, 2023

Related U.S. Application Data

(63) Continuation of application No. 17/717,520, filed on Apr. 11, 2022, now Pat. No. 11,728,180, which is a
(Continued)

(51) Int. Cl.
*H01L 23/48*     (2006.01)
*H01L 21/48*     (2006.01)
(Continued)

(52) U.S. Cl.
CPC .... *H01L 21/4853* (2013.01); *H01L 23/49827* (2013.01); *H01L 23/49838* (2013.01);
(Continued)

(58) Field of Classification Search
CPC . H01L 2224/73265; H01L 2224/48227; H01L 2924/014; H01L 2924/01028;
(Continued)

(56) References Cited

U.S. PATENT DOCUMENTS 6,232,212 B1    5/2001   Degani et al.
6,825,568 B2    11/2004  Hung
(Continued)

FOREIGN PATENT DOCUMENTS

CN    101197339 A    *   6/2008
JP    2003007755 A   *   1/2003   ......... H01L 21/2885
(Continued)

OTHER PUBLICATIONS

Korean language office action dated Oct. 25, 2022, issued in application No. KR 10-2021-0016155.
(Continued)

*Primary Examiner* — Niki H Nguyen
(74) *Attorney, Agent, or Firm* — McClure, Qualey & Rodack, LLP

(57) ABSTRACT

A chip package structure is provided. The chip package structure includes a wiring substrate including a substrate, a first pad, and a second pad. The first pad and the second pad are respectively over a first surface and a second surface of the substrate, and the first pad is narrower than the second pad. The chip package structure includes a nickel layer over the first pad. The nickel layer has a T-shape in a cross-sectional view of the nickel layer. The chip package structure includes a chip over the wiring substrate. The chip package structure includes a conductive bump between the nickel layer and the chip.

20 Claims, 35 Drawing Sheets

Related U.S. Application Data continuation of application No. 16/837,381, filed on Apr. 1, 2020, now Pat. No. 11,302,537.

(51) Int. Cl.
  *H01L 23/00* (2006.01)
  *H01L 23/498* (2006.01)
  *H01L 23/52* (2006.01)
  *H01L 29/40* (2006.01)

(52) U.S. Cl.
  CPC ........ *H01L 23/49866* (2013.01); *H01L 24/16* (2013.01); *H01L 24/81* (2013.01); *H01L 2224/16227* (2013.01); *H01L 2224/81035* (2013.01); *H01L 2224/81047* (2013.01); *H01L 2224/81192* (2013.01); *H01L 2224/81395* (2013.01); *H01L 2224/81411* (2013.01); *H01L 2224/81444* (2013.01); *H01L 2224/81447* (2013.01); *H01L 2224/81455* (2013.01); *H01L 2224/81493* (2013.01)

(58) Field of Classification Search
  CPC . H01L 2224/16225; H01L 2924/15311; H01L 2224/05655; H01L 2224/0401; H01L 2224/05147; H01L 2224/13155; H01L 24/81; H01L 2224/13006; H01L 2224/13022; H01L 2224/16; H01L 2224/16145; H01L 2224/81193; H01L 2224/16227; H01L 2225/06513; H01L 24/29; H01L 24/32; H01L 2224/119; H01L 2224/81801; H01L 23/49816; H01L 24/02; H01L 2924/1517; H01L 2924/15173; H01L 2224/023; H01L 2224/0233; H01L 2224/0235; H01L 2224/05255; H01L 2224/05755; H01L 2924/07025; H01L 2224/04026; H01L 2224/13024; H01L 2224/13025; H01L 2224/83815; H01L 21/4853; H01L 23/49827; H01L 23/49838; H01L 23/49866; H01L 24/16; H01L 2224/81035; H01L 2224/81047; H01L 2224/81192; H01L 2224/81395; H01L 2224/81411; H01L 2224/81444; H01L 2224/81447; H01L 2224/81455
  See application file for complete search history.

(56) References Cited

U.S. PATENT DOCUMENTS

| | | | |
|---|---|---|---|
| 8,703,600 B2 * | 4/2014 | Migita | ............ H01L 24/11 |
| | | | 438/612 |
| 8,763,600 B2 | 7/2014 | Catalogne et al. | |
| 11,302,537 B2 | 4/2022 | Hsu et al. | |
| 2002/0037643 A1 | 3/2002 | Ishimaru | |
| 2007/0141750 A1 | 6/2007 | Iwasaki et al. | |
| 2012/0064712 A1 | 3/2012 | Lei et al. | |
| 2013/0277838 A1 | 10/2013 | Yu et al. | |
| 2015/0029689 A1 * | 1/2015 | Imafuji | ............ H05K 1/111 |
| | | | 361/767 |
| 2019/0214358 A1 | 7/2019 | Ha et al. | |
| 2020/0043879 A1 | 2/2020 | Jeng et al. | |

FOREIGN PATENT DOCUMENTS

| | | |
|---|---|---|
| KR | 10-2000-0071360 A | 11/2000 |
| KR | 10-2007-0083169 A | 8/2007 |
| KR | 10-2013-0118719 A | 10/2013 |
| KR | 10-2019-0085590 A | 7/2019 |
| WO | 2007/097508 A1 | 8/2007 |

OTHER PUBLICATIONS

Chinese language office action dated Apr. 17, 2023, issued in application No. TW 110111294.

* cited by examiner

CHIP PACKAGE STRUCTURE WITH NICKEL LAYER

CROSS REFERENCE

This application is a Continuation of U.S. application Ser. No. 17/717,520, filed on Apr. 11, 2022 (now U.S. Pat. No. 11,728,180), which is a Continuation of U.S. application Ser. No. 16/837,381, filed on Apr. 1, 2020 (now U.S. Pat. No. 11,302,537), the entirety of which is incorporated by reference herein.

BACKGROUND

Semiconductor devices are used in a variety of electronic applications, such as personal computers, cell phones, digital cameras, and other electronic equipment.

Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
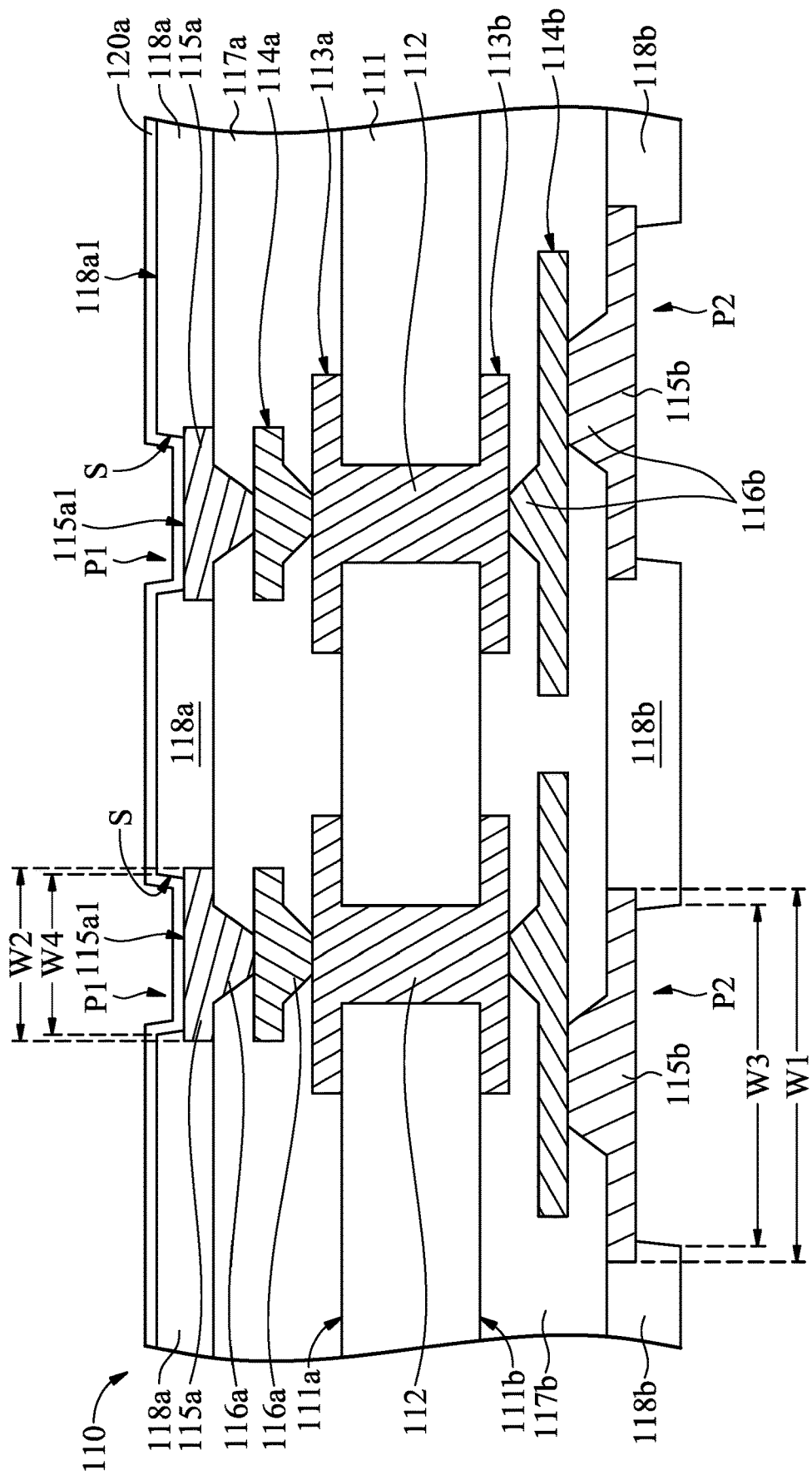
FIGS. 1A-1E are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a chip package structure, in accordance with some embodiments. As shown in FIG. 1A, a wiring substrate 110 is provided, in accordance with some embodiments. The wiring substrate 110 includes a substrate 111, through substrate vias (or plated through holes, PTH) 112, wiring layers 113a, 113b, 114a and 114b, pads 115a and 115b, conductive vias 116a and 116b, insulating layers 117a and 117b, and polymer layers 118a and 118b, in accordance with some embodiments.

The substrate 111 has surfaces 111a and 111b, in accordance with some embodiments. The surface 111a is opposite to the surface 111b, in accordance with some embodiments. In some embodiments, the substrate 111 is made of an insulating material such as a fiber material, a polymer material (e.g., a polymer organic material), or a glass material. The fiber material includes, for example, a glass fiber material.

In some other embodiments, the substrate 111 is made of a semiconductor material or a conductive material, in accordance with some embodiments. The semiconductor material includes, for example, silicon or germanium. The conductive material includes, for example, a metal material.

The through substrate vias 112 pass through the substrate 111, in accordance with some embodiments. The wiring layers 113a and 113b are formed over the surfaces 111a and 111b respectively, in accordance with some embodiments. The through substrate vias 112 electrically connect the wiring layer 113a to the wiring layer 113b, in accordance with some embodiments.

If the substrate 111 is made of a semiconductor material or a conductive material, an insulating layer (not shown) is formed between the substrate 111 and the through substrate vias 112 and between the substrate 111 and the wiring layers 113a and 113b to electrically insulate the substrate 111 from the through substrate vias 112 and the wiring layers 113a and 113b, in accordance with some embodiments.

The wiring layer 114a, the pads 115a, the conductive vias 116a, the insulating layer 117a, and the polymer layer 118a are formed over the surface 111a, in accordance with some embodiments. The wiring layer 114a and the conductive vias 116a are in the insulating layer 117a, in accordance with some embodiments. The pads 115a are positioned over the insulating layer 117a, in accordance with some embodiments. The conductive vias 116a are electrically connected between the wiring layers 113a and 114a and between the wiring layer 114a and the pads 115a, in accordance with some embodiments.

The polymer layer 118a is formed over the insulating layer 117a and the pads 115a, in accordance with some embodiments. The polymer layer 118a has openings P1, in accordance with some embodiments. The openings P1 respectively expose the pads 115a thereunder, in accordance with some embodiments. The polymer layer 118a partially covers the pads 115a, in accordance with some embodiments.

The polymer layer 118a is a solder resist layer, an Ajinomoto build-up film (ABF), or a prepreg (PP), in accordance with some embodiments. The solder resist layer is made of a solder resist (SR) material, in accordance with some embodiments. The polymer layer 118a is made of any suitable polymer material, such as resin or polyimide, in accordance with some embodiments.

The wiring layer 114b, the pads 115b, the conductive vias 116b, the insulating layer 117b, and the polymer layer 118b are formed over the surface 111b, in accordance with some embodiments. The wiring layer 114b and the conductive vias 116b are in the insulating layer 117b, in accordance with some embodiments. The pads 115b are over the insulating layer 117b, in accordance with some embodiments. The conductive vias 116b are electrically connected between the wiring layers 113b and 114b and between the wiring layer 114b and the pads 115b, in accordance with some embodiments.

The polymer layer 118b is formed over the insulating layer 117b and the pads 115b, in accordance with some embodiments. The polymer layer 118b has openings P2, in accordance with some embodiments. The openings P2 respectively expose the pads 115b, in accordance with some embodiments. The polymer layer 118b partially covers the pads 115b, in accordance with some embodiments.

The polymer layer 118b is a solder resist layer, an Ajinomoto build-up film (ABF), or a prepreg (PP), in accordance with some embodiments. The solder resist layer is made of a solder resist (SR) material, in accordance with some embodiments. The polymer layer 118b is made of any suitable polymer material, such as resin or polyimide, in accordance with some embodiments.

In some embodiments, the pad 115a is narrower than the pad 115b. That is, a width W1 of the pad 115b is greater than a width W2 of the pad 115a, in accordance with some embodiments. The width W1 ranges from about 200 μm to about 600 μm, in accordance with some embodiments. The width W2 ranges from about 20 μm to about 110 μm, in accordance with some embodiments. In some embodiments, a (maximum) width W3 of the opening P2 is greater than a (maximum) width W4 of the opening P1.

The through substrate vias 112, the wiring layers 113a, 113b, 114a and 114b, the pads 115a and 115b, and the conductive vias 116a and 116b are made of a conductive material such as a metal material or an alloy thereof, in accordance with some embodiments. The metal material includes aluminum, copper or tungsten, in accordance with some embodiments.

As shown in FIG. 1A, a conductive adhesive material layer 120a is formed over the polymer layer 118a and the pads 115a, in accordance with some embodiments. The conductive adhesive material layer 120a conformally covers a top surface 118a1 of the polymer layer 118a, inner walls S of the openings P1, and top surfaces 115a1 of the pads 115a, in accordance with some embodiments.

The conductive adhesive material layer 120a is in direct contact with the polymer layer 118a and the pads 115a, in accordance with some embodiments. The conductive adhesive material layer 120a passes through the polymer layer 118a, in accordance with some embodiments. The conductive adhesive material layer 120a is a single layer structure, in accordance with some embodiments. In some other embodiments, the conductive adhesive material layer 120a is a multilayer structure.

The conductive adhesive material layer 120a is made of nickel (Ni), titanium (Ti), copper (Cu), palladium (Pd), an alloy thereof, a combination thereof, or another suitable metal or alloy, in accordance with some embodiments. The conductive adhesive material layer 120a is formed using a deposition process (e.g., a sputtering process) or a plating process (e.g., an electroless plating process), in accordance with some embodiments.

Figure 1B:
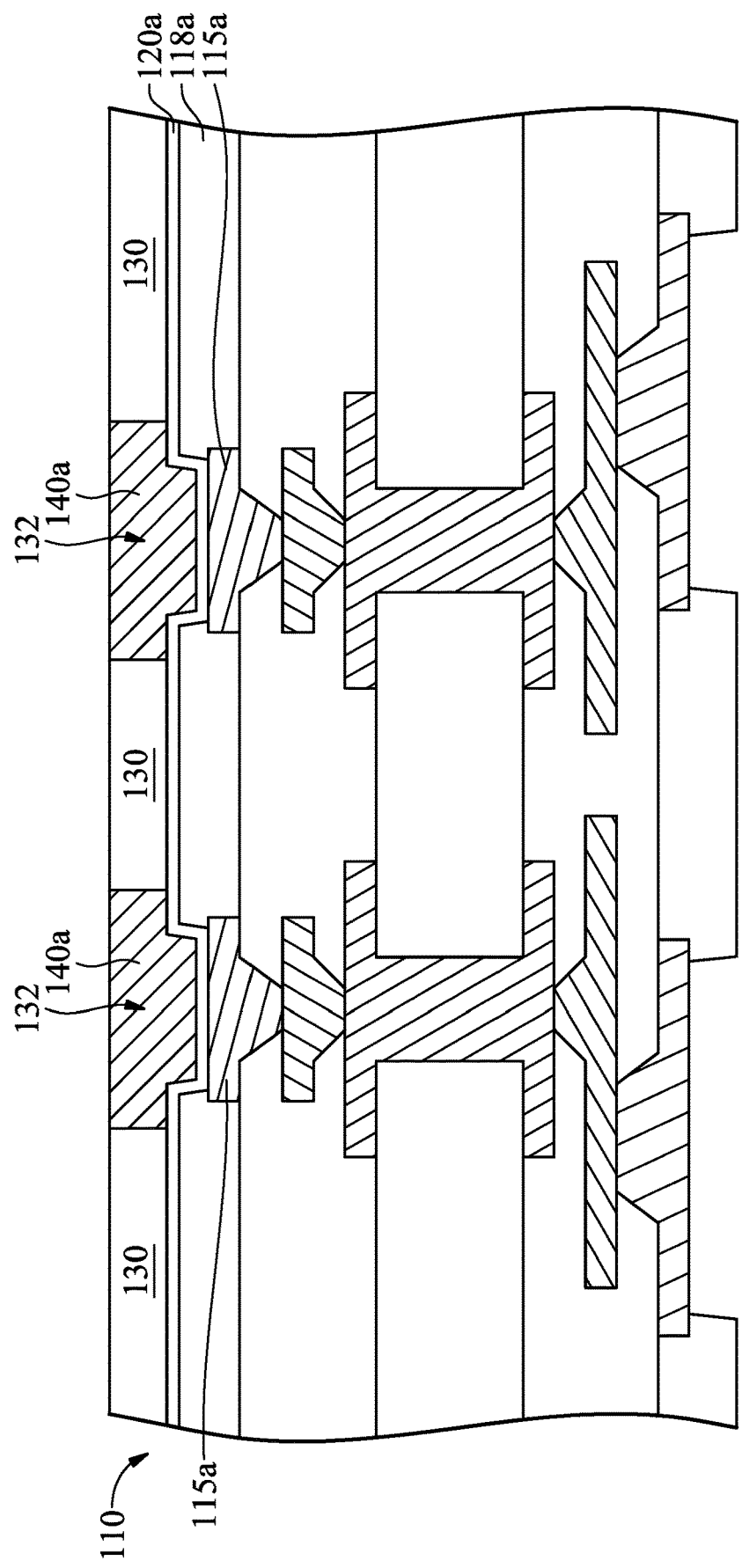

As shown in FIG. 1B, a mask layer 130 is formed over the conductive adhesive material layer 120a, in accordance with some embodiments. The mask layer 130 has openings 132, in accordance with some embodiments. The openings 132 expose the conductive adhesive material layer 120a over or adjacent to the pads 115a, in accordance with some embodiments. The mask layer 130 is made of a photoresist material, such as a polymer material, in accordance with some embodiments.

As shown in FIG. 1B, a solder layer 140a is formed in the openings 132, in accordance with some embodiments. The solder layer 140a is formed over the conductive adhesive material layer 120a, in accordance with some embodiments. The solder layer 140a is in direct contact with the conductive adhesive material layer 120a, in accordance with some embodiments.

The solder layer 140*a* is made of a suitable solder material, such as tin (Sn) or tin alloy, in accordance with some embodiments. The solder layer 140*a* is formed using a plating process, such as an electroplating process, in accordance with some embodiments. The conductive adhesive material layer 120*a* is used as a seed layer in the electroplating process, in accordance with some embodiments.

Figure 1C:
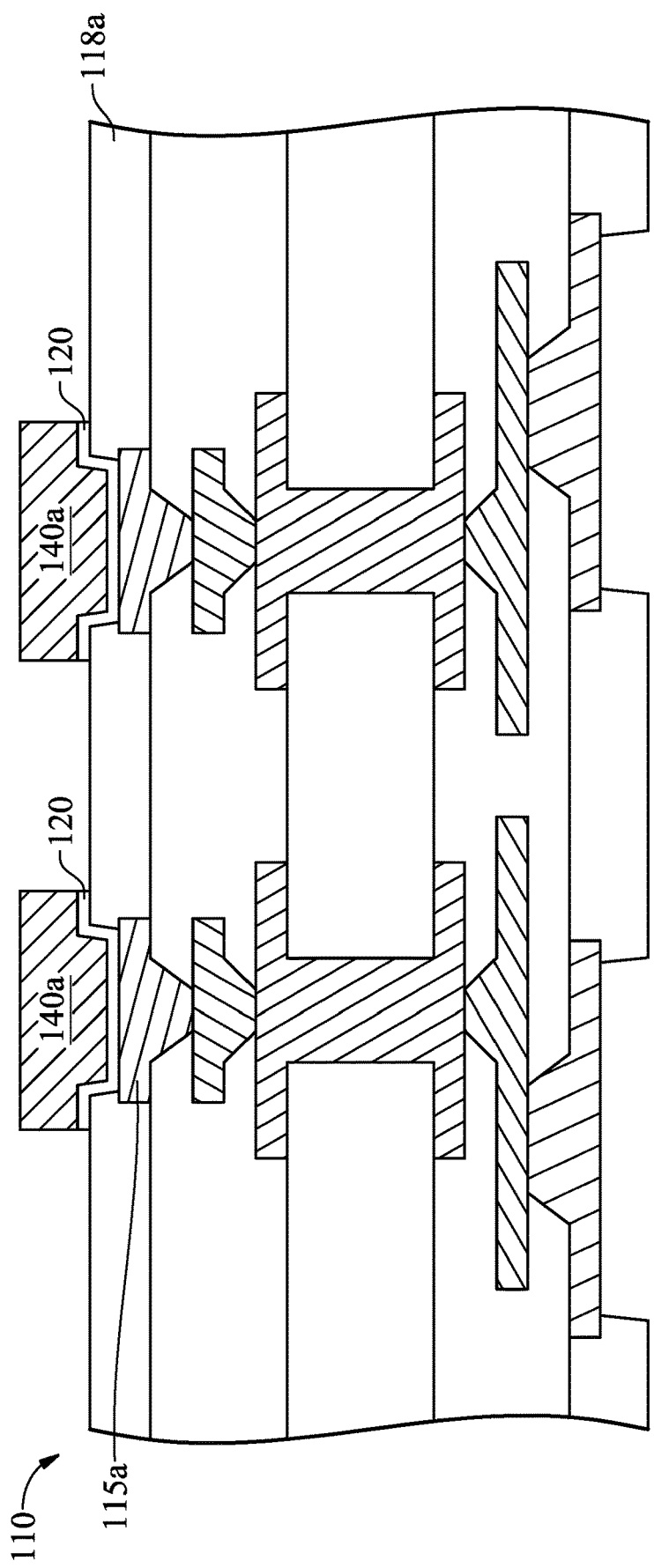

As shown in FIGS. 1B-1C, the mask layer 130 and the conductive adhesive material layer 120*a* under the mask layer 130 are removed, in accordance with some embodiments. The conductive adhesive material layer 120*a* remaining under the solder layer 140*a* forms a conductive adhesive layer 120, in accordance with some embodiments. The conductive adhesive layer 120 is able to improve the adhesion between the solder layer 140*a* and the polymer layer 118*a* and between the solder layer 140*a* and the pads 115*a*, in accordance with some embodiments.

Figure 1D:
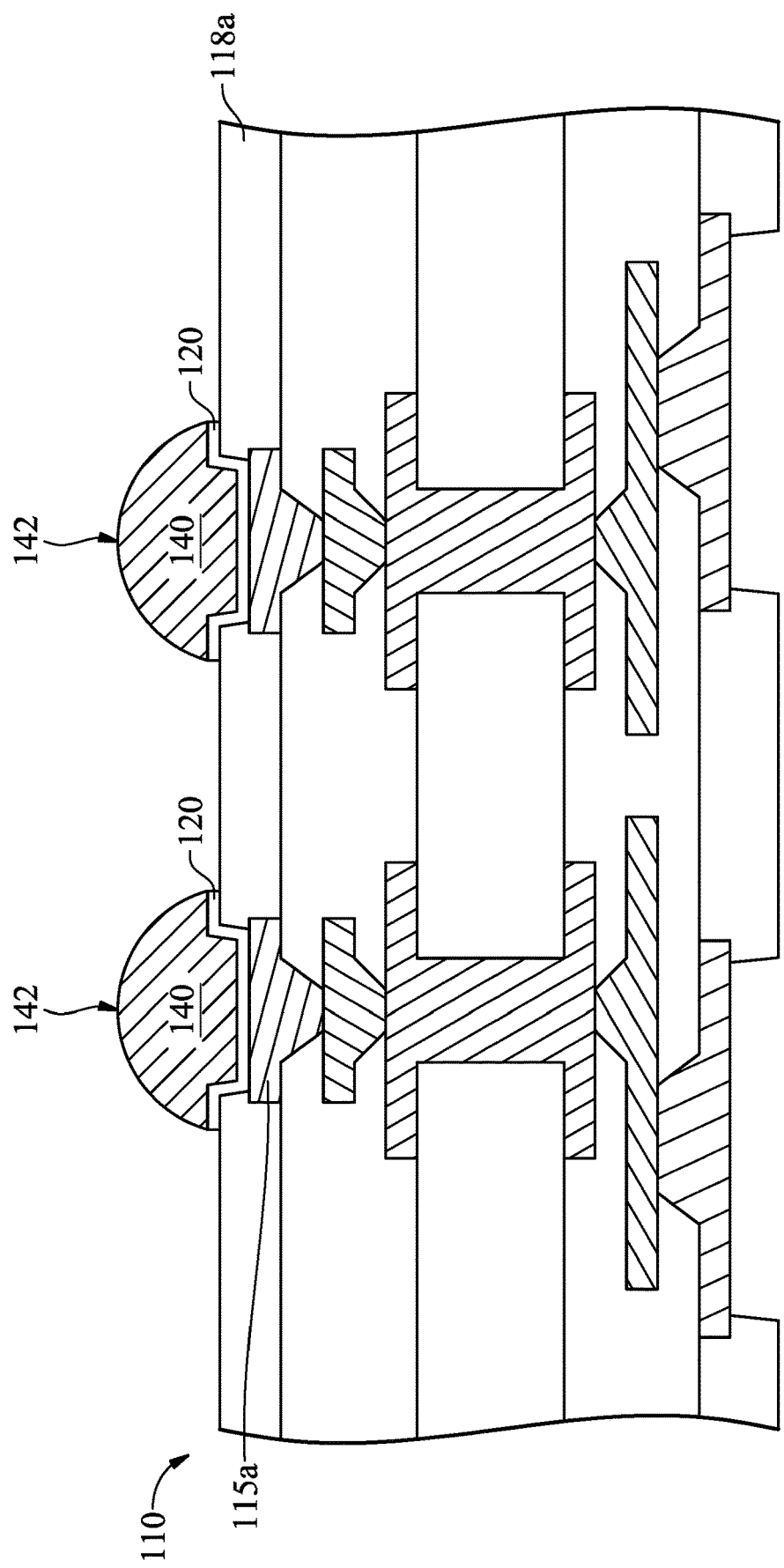

As shown in FIG. 1D, a reflow process is performed over the solder layer 140*a*, in accordance with some embodiments. The reflowed solder layer 140*a* forms solder structures 140, in accordance with some embodiments. The solder structures 140 have top surfaces 142, in accordance with some embodiments. The top surfaces 142 are curved top surfaces, in accordance with some embodiments. The process temperature of the reflow process ranges from about 200° C. to about 300° C., in accordance with some embodiments.

Figure 1E:
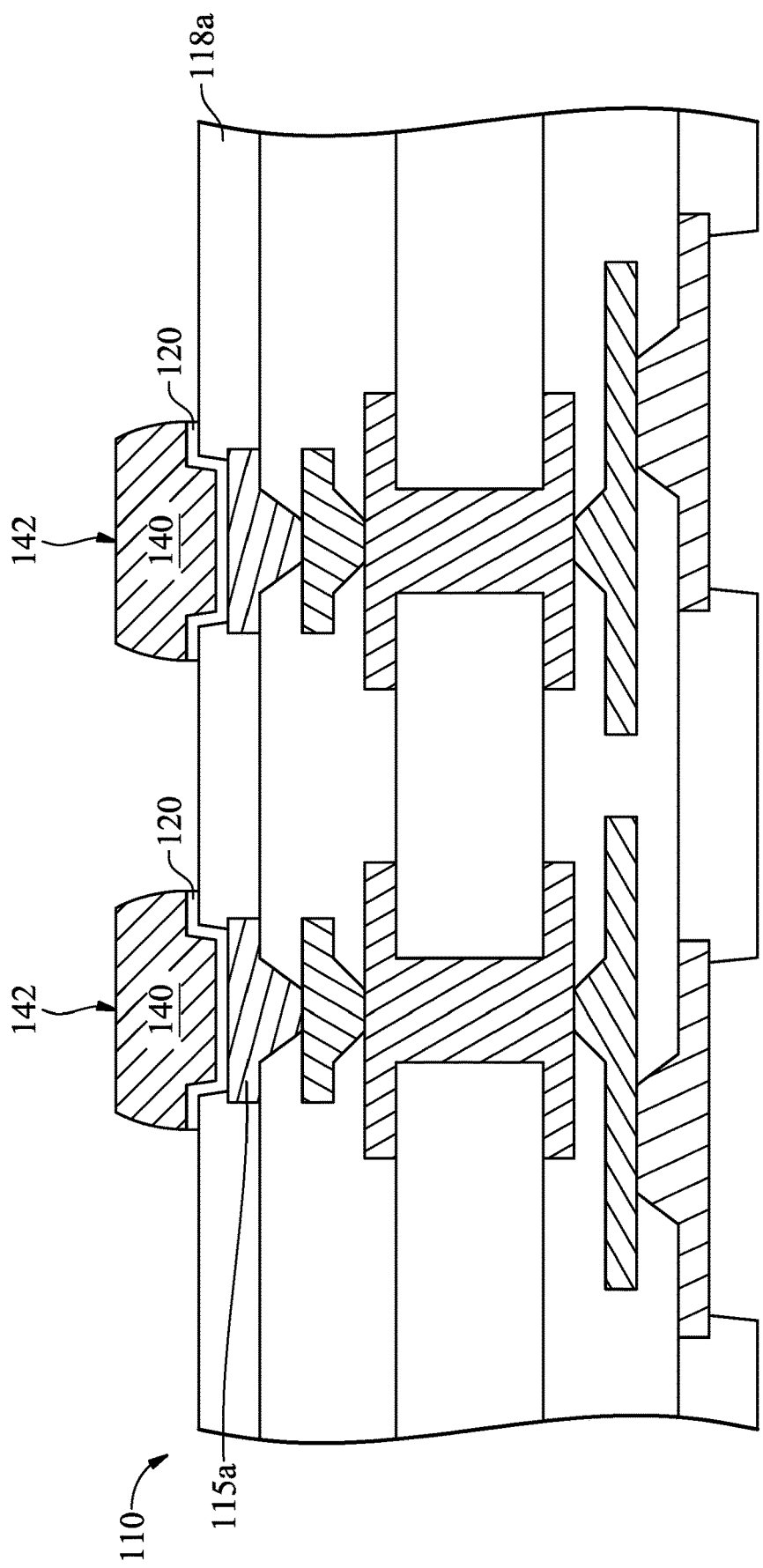

As shown in FIG. 1E, a thermo-compression process is performed over the solder structures 140 to flatten the top surfaces 142 of the solder structures 140, in accordance with some embodiments. The process temperature of the thermo-compression process ranges from about 50° C. to about 150° C., in accordance with some embodiments.

Figure 2:
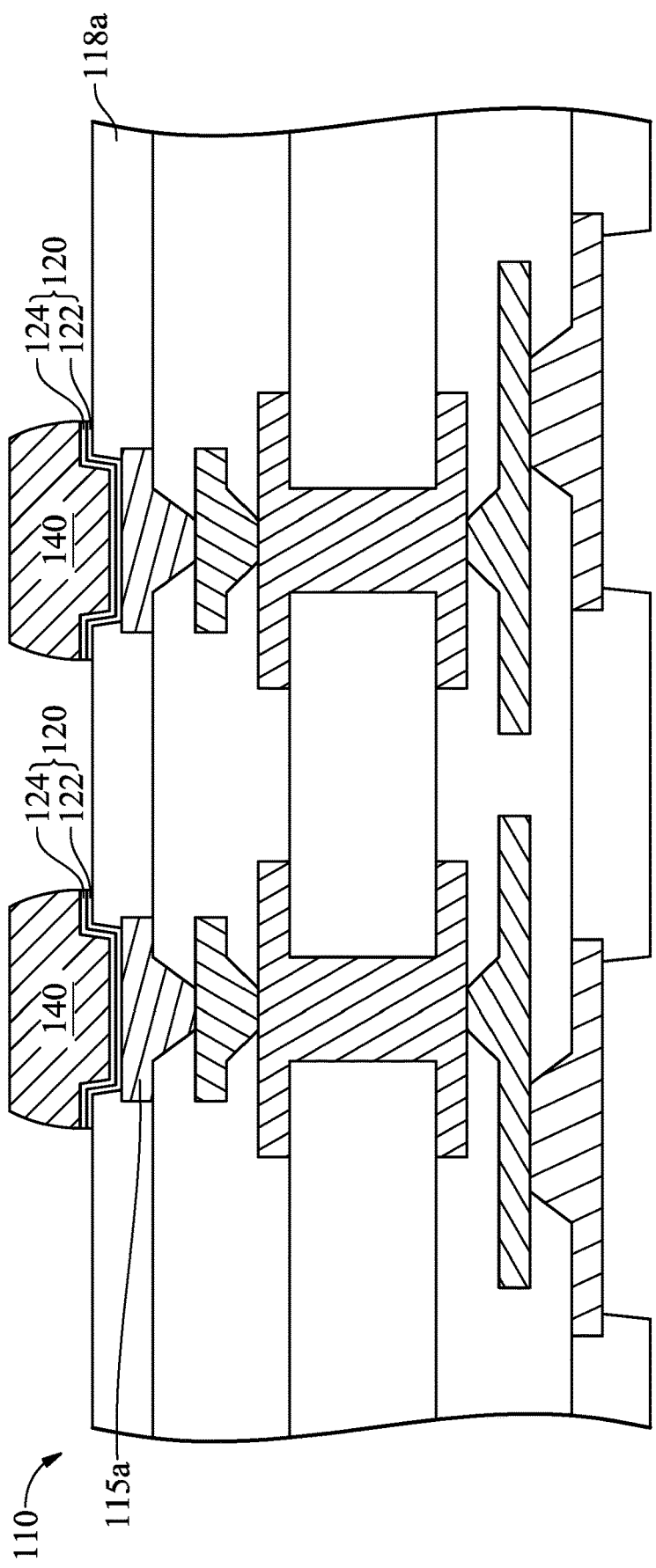
FIG. 2 is a cross-sectional view of a stage of a process for forming a chip package structure, in accordance with some embodiments.

In some embodiments, the conductive adhesive layer 120 is a single layer structure, in accordance with some embodiments. In some other embodiments, as shown in FIG. 2, the conductive adhesive layer 120 is a multilayer structure, in accordance with some embodiments. The conductive adhesive layer 120 includes layers 122 and 124, in accordance with some embodiments.

In some embodiments, the layer 122 is made of copper, and the layer 124 is made of nickel, in accordance with some embodiments. In some other embodiments, the layer 122 is made of titanium, and the layer 124 is made of copper, in accordance with some embodiments. In still other embodiments, the layer 122 is made of palladium, and the layer 124 is made of copper, in accordance with some embodiments.

Figure 3A:
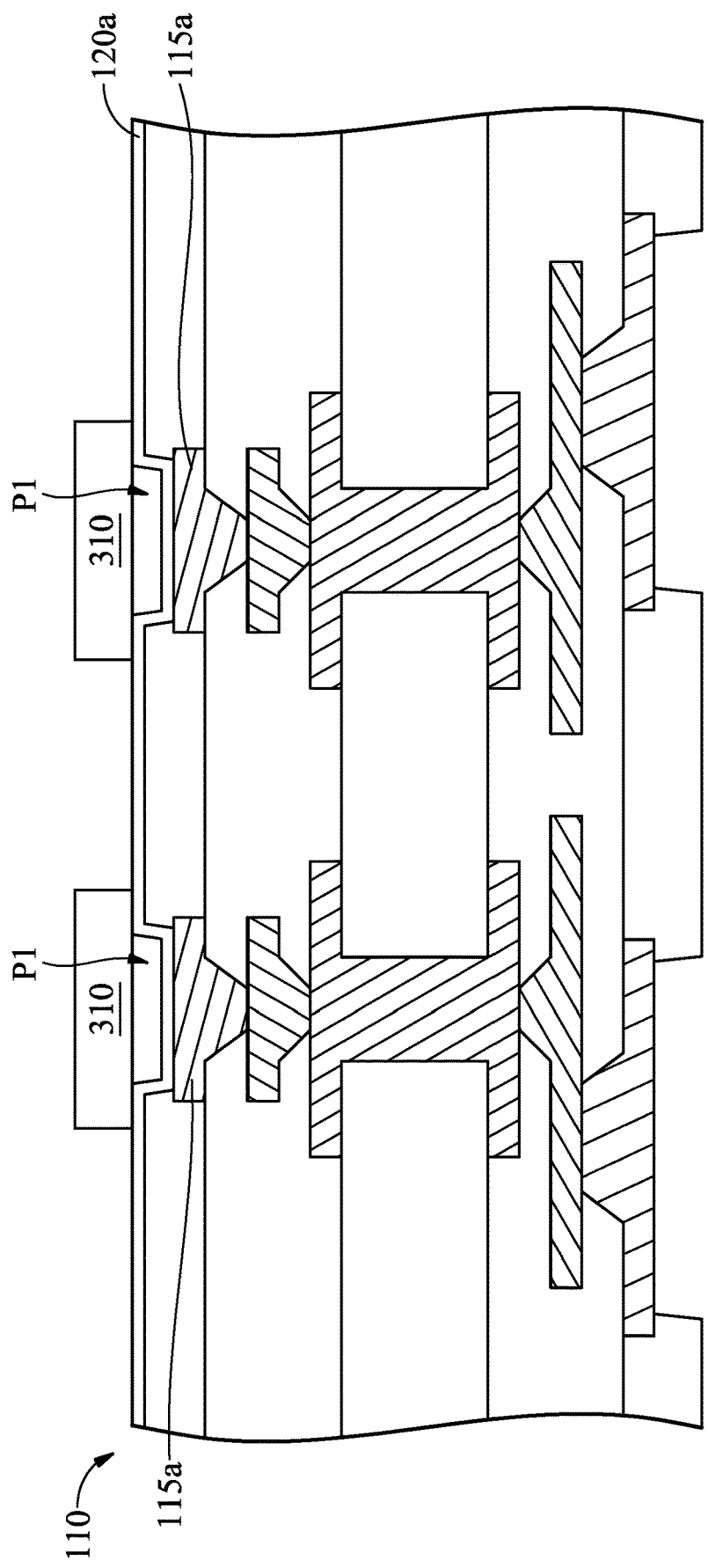
FIGS. 3A-3C are cross-sectional views of various stages of a process for forming a chip package structure, in accordance with some embodiments.
Figure 3B:
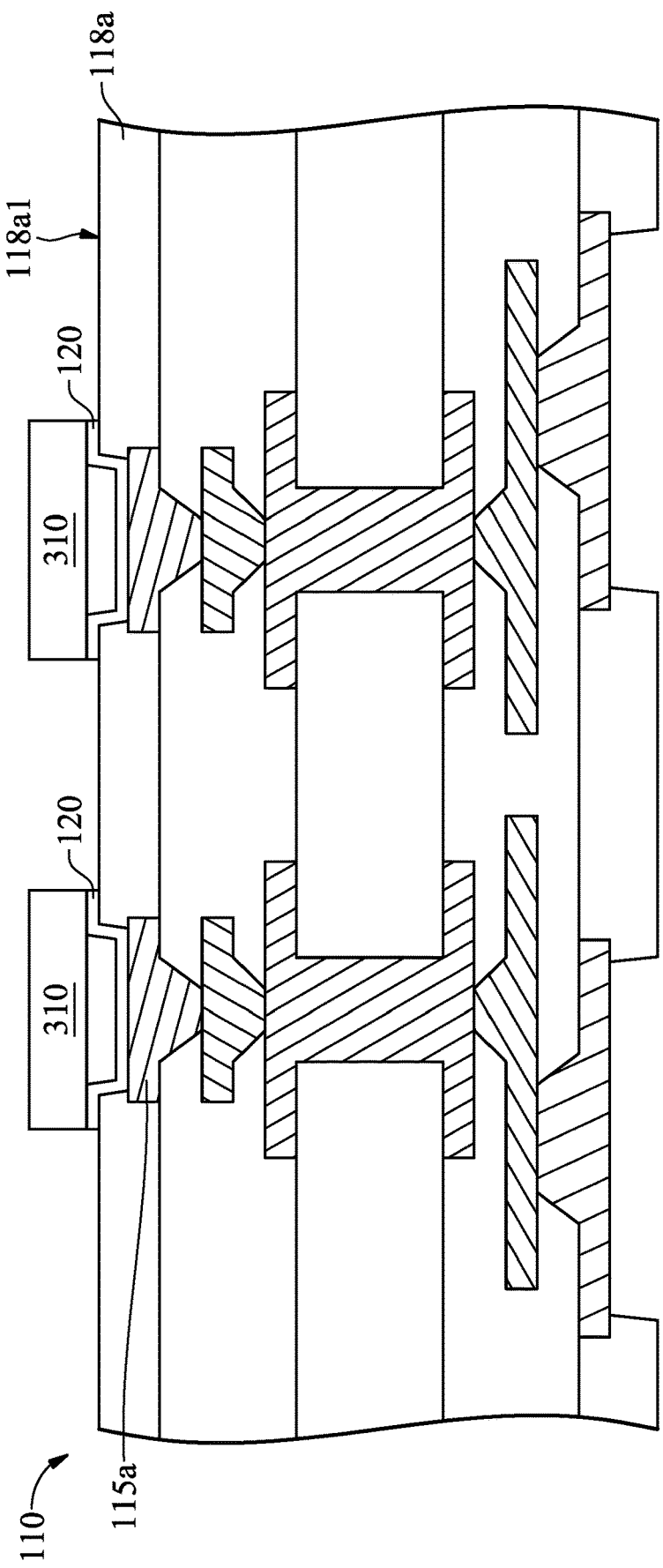
Figure 3C:
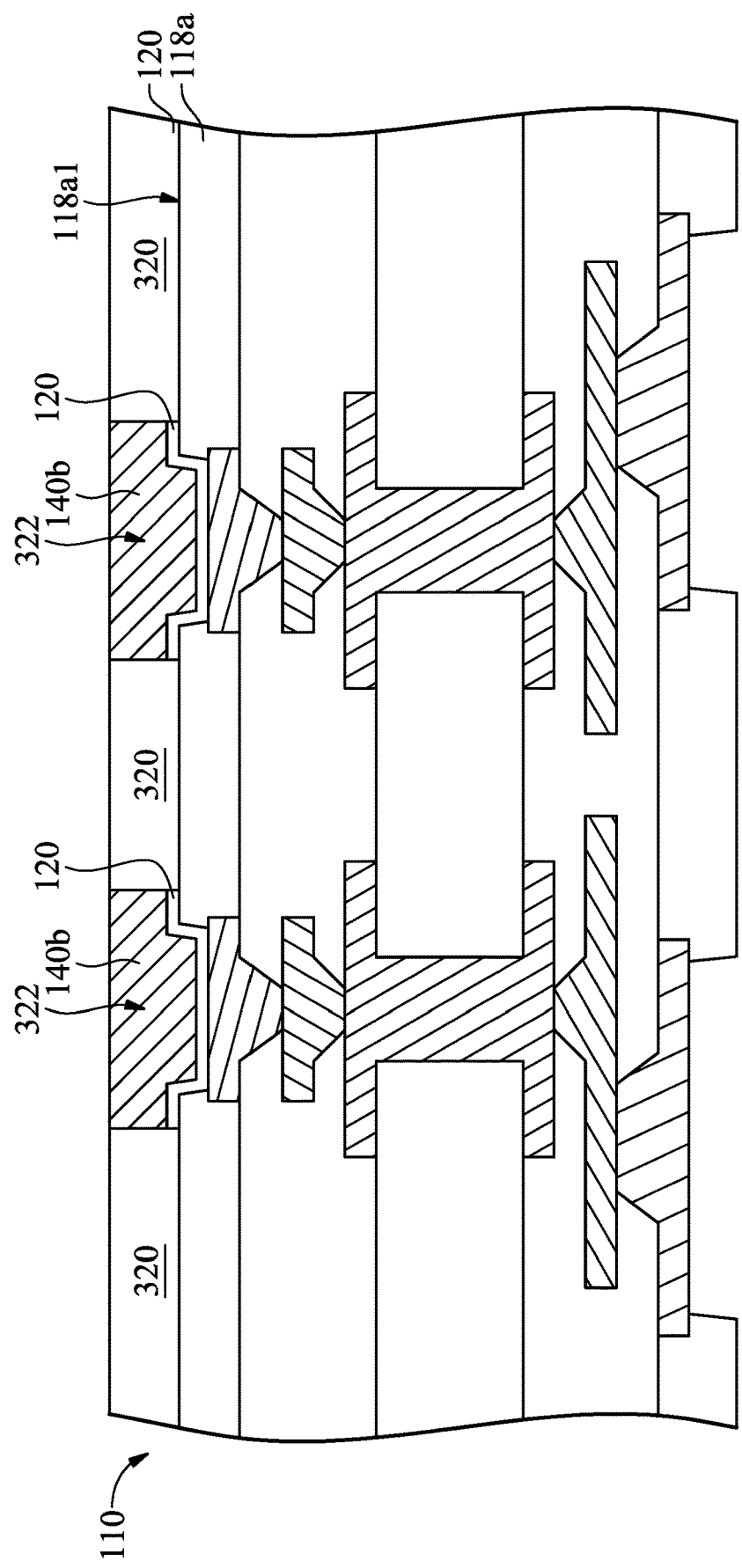

FIGS. 3A-3C are cross-sectional views of various stages of a process for forming a chip package structure, in accordance with some embodiments. As shown in FIG. 3A, after the step of FIG. 1A, a mask layer 310 is formed over the conductive adhesive material layer 120*a* over or adjacent to the pads 115*a*, in accordance with some embodiments. The mask layer 310 is also referred to as a dry film, in accordance with some embodiments. The mask layer 310 is made of a polymer material, in accordance with some embodiments.

As shown in FIGS. 3A-3B, the conductive adhesive material layer 120*a* exposed by the mask layer 310 is removed, in accordance with some embodiments. The conductive adhesive material layer 120*a* remaining under the mask layer 310 forms a conductive adhesive layer 120, in accordance with some embodiments.

As shown in FIG. 3C, the mask layer 310 is removed, in accordance with some embodiments. As shown in FIG. 3C, a mask layer 320 is formed over the polymer layer 118*a*, in accordance with some embodiments. The mask layer 320 has openings 322 exposing the conductive adhesive layer 120, in accordance with some embodiments. The mask layer 320 is made of a photoresist material, such as a polymer material, in accordance with some embodiments.

As shown in FIG. 3C, a printing process is performed to form a solder layer 140*b* in the openings 322, in accordance with some embodiments. The solder layer 140*b* is made of a suitable solder material, such as tin (Sn) or tin alloy, in accordance with some embodiments. Thereafter, as shown in FIG. 1D, the mask layer 320 is removed and a reflow process is performed over the solder layer 140*b* to form solder structures 140, in accordance with some embodiments.

Figure 4:
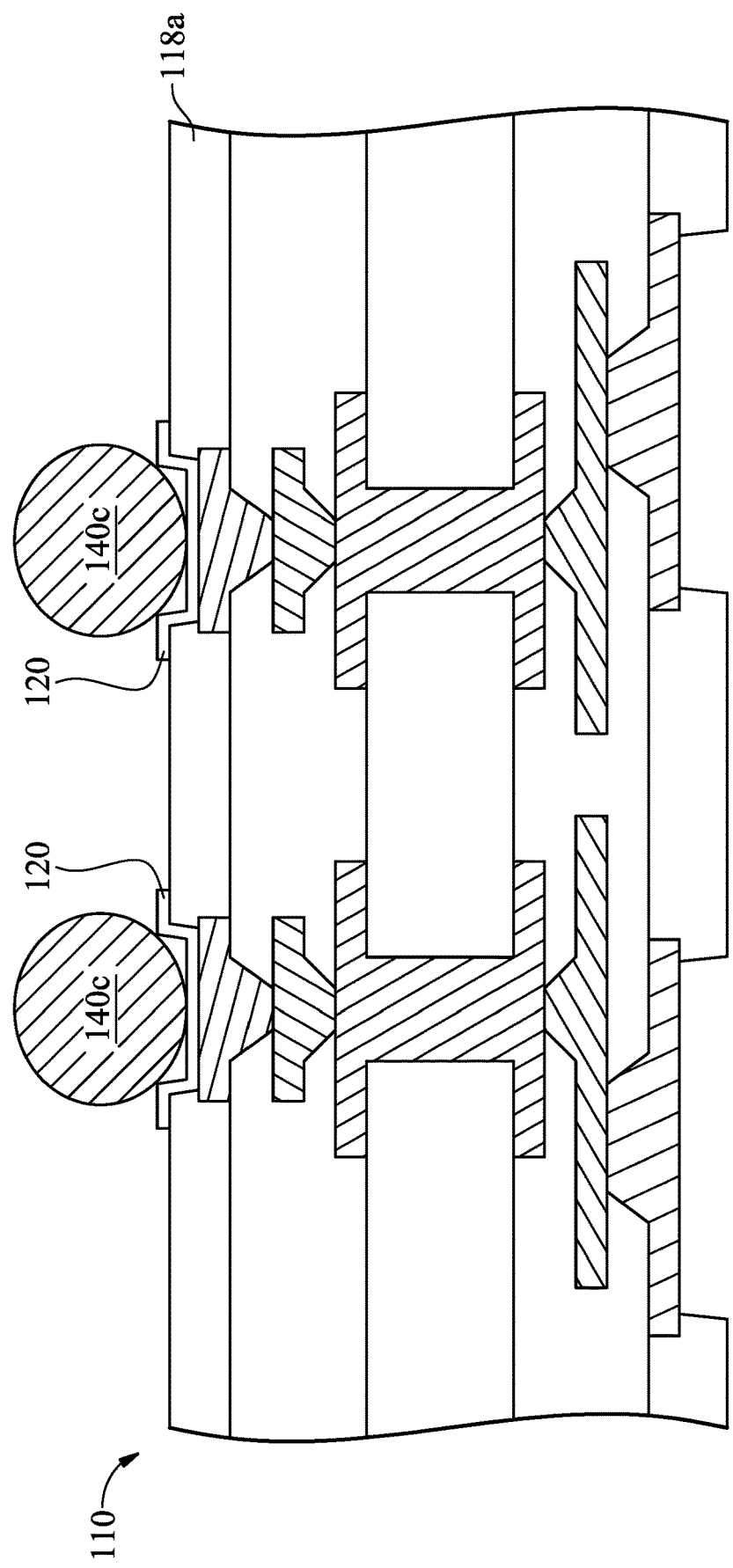
FIG. 4 is a cross-sectional view of a stage of a process for forming a chip package structure, in accordance with some embodiments.

FIG. 4 is a cross-sectional view of a stage of a process for forming a chip package structure, in accordance with some embodiments. As shown in FIG. 4, after the step of FIG. 3B, the mask layer 310 is removed, in accordance with some embodiments. As shown in FIG. 4, solder balls 140*c* are disposed over the conductive adhesive layer 120, in accordance with some embodiments. Thereafter, as shown in FIG. 1D, the solder balls 140*c* are reflowed to form solder structures 140, in accordance with some embodiments.

Figure 5A:
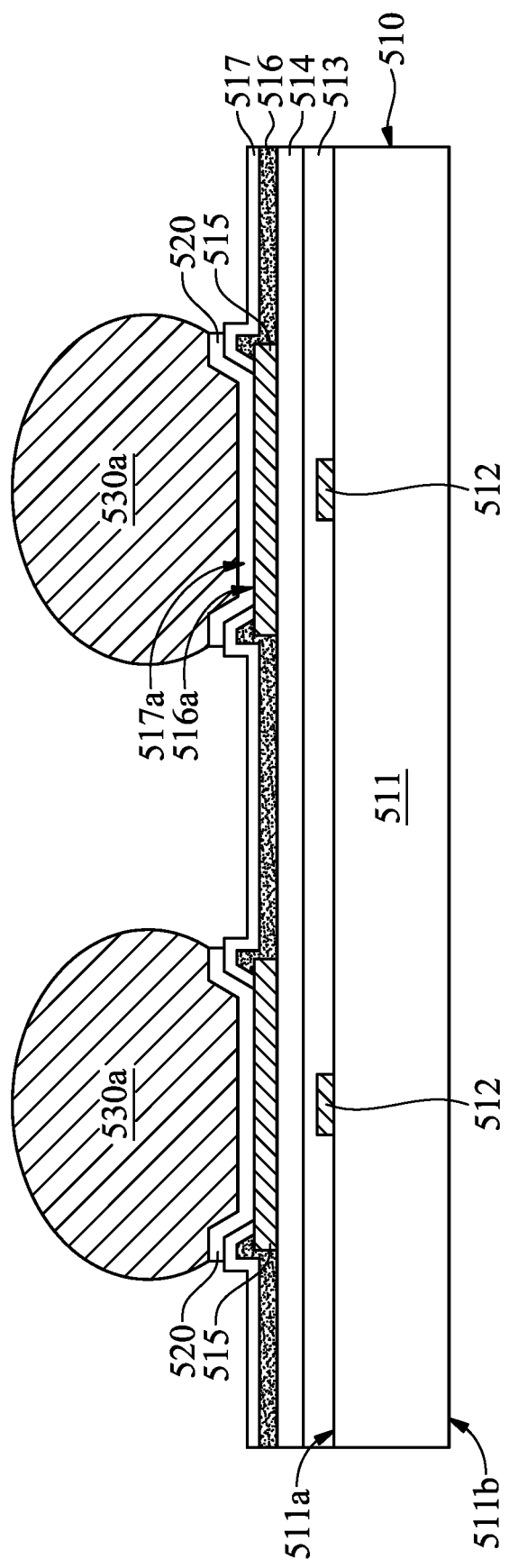
FIGS. 5A-5D are cross-sectional views of various stages of a process for forming a chip package structure, in accordance with some embodiments.

FIGS. 5A-5D are cross-sectional views of various stages of a process for forming a chip package structure, in accordance with some embodiments. As shown in FIG. 5A, after the step of FIG. 1E, a chip 510 is provided, in accordance with some embodiments. The chip 510 includes a semiconductor substrate 511, elements 512, a dielectric layer 513, an interconnection layer 514, conductive pads 515, an insulating layer 516, and a buffer layer 517, in accordance with some embodiments.

The semiconductor substrate 511 has a front surface 511*a* and a back surface 511*b* opposite to the front surface 511*a*, in accordance with some embodiments. In some embodiments, the semiconductor substrate 511 is made of at least an elementary semiconductor material including silicon or germanium in a single crystal, polycrystal, or amorphous structure. In some other embodiments, the semiconductor substrate 511 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 511 may also include multi-layer semiconductors, semiconductor on insulator (SOI) (such as silicon on insulator or germanium on insulator), or a combination thereof.

In some embodiments, the elements 512 are formed over the front surface 511*a* or in the semiconductor substrate 511 adjacent to the front surface 511*a*. The elements 512 include active elements (e.g. transistors, diodes, or the like) and/or passive elements (e.g. resistors, capacitors, inductors, or the like), in accordance with some embodiments.

The dielectric layer 513 is formed over the front surface 511*a* and the elements 512, in accordance with some embodiments. The dielectric layer 513 is made of oxide material such as silicon oxide, in accordance with some embodiments. In some other embodiments, the dielectric layer 513 is made of a polymer material, such as polybenzoxazole (PBO), polyimide, benzocyclobutene (BCB), epoxy, a photo-sensitive material, or another suitable material.

The interconnection layer 514 is formed over the dielectric layer 513, in accordance with some embodiments. The interconnection layer 514 includes dielectric layers (not shown) and conductive interconnection structures (not shown) in the dielectric layers, in accordance with some embodiments.

The conductive pads 515 are formed over the interconnection layer 514, in accordance with some embodiments. The conductive pads 515 are electrically connected to the elements 512 through the interconnection layer 514, in accordance with some embodiments. The conductive pads 515 are made of a conductive material, such as copper (Cu), copper alloy, aluminum (Al), aluminum alloy, tungsten (W), tungsten alloy, titanium (Ti), titanium alloy, tantalum (Ta) or tantalum alloy, in accordance with some embodiments.

The insulating layer 516 is formed over the interconnection layer 514 and peripheral portions of the conductive pads 515, in accordance with some embodiments.

The insulating layer 516 has openings 516a exposing central portions of the conductive pads 515, in accordance with some embodiments.

The insulating layer 516 is made of a dielectric material, such as undoped silicate glass (USG), silicon nitride, silicon oxide, or silicon oxynitride, in accordance with some embodiments. The insulating layer 516 is formed using a deposition process (e.g., a chemical vapor deposition process or a physical vapor deposition process) and an etching process, in accordance with some embodiments.

The buffer layer 517 is formed over the insulating layer 516, in accordance with some embodiments. The buffer layer 517 is further formed over the peripheral portions of the conductive pads 515, in accordance with some embodiments.

The buffer layer 517 has openings 517a exposing central portions of the conductive pads 515, in accordance with some embodiments. The buffer layer 517 is used to buffer the bonding stress from bumps subsequently formed over the conductive pads 515 during subsequent bonding processes, in accordance with some embodiments.

The buffer layer 517 is made of a material softer than the insulating layer 516 and/or the conductive pads 515, in accordance with some embodiments. The buffer layer 517 is made of a polymer material such as epoxy, polyimide, benzocyclobutene (BCB), polybenzoxazole (PBO), or another suitable material, in accordance with some embodiments.

As shown in FIG. 5A, an under bump metallurgy (UBM) layer 520 is formed over the conductive pads 515 and the buffer layer 517 adjacent to the conductive pads 515, in accordance with some embodiments. The under bump metallurgy layer 520 is made of titanium, titanium nitride, tantalum, tantalum nitride, copper, or copper alloy including silver, chromium, nickel, tin and/or gold, in accordance with some embodiments.

As shown in FIG. 5A, solder structures 530a are formed over the under bump metallurgy layer 520, in accordance with some embodiments. The solder structures 530a are made of a suitable solder material, such as tin (Sn) or tin alloy, in accordance with some embodiments.

Figure 5B:
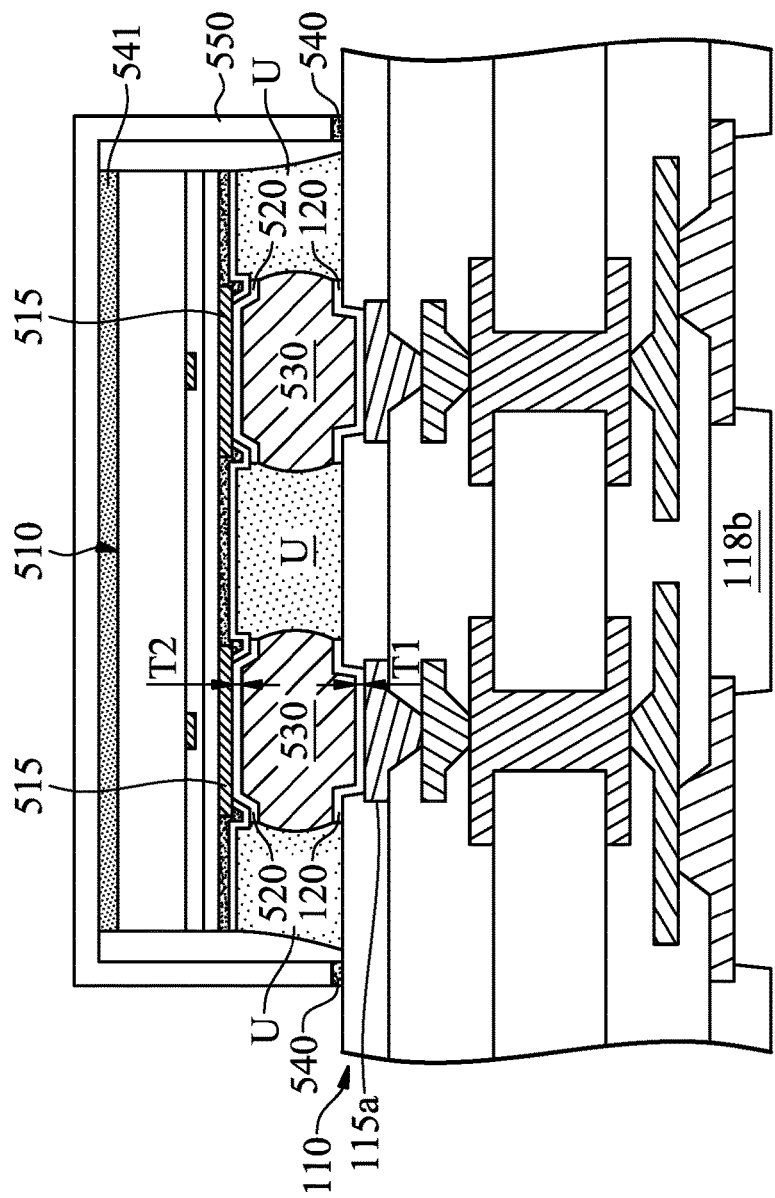

As shown in FIG. 5B, the chip 510 is bonded to the wiring substrate 110 through conductive bumps 530, in accordance with some embodiments. The conductive bumps 530 are between and connected to the conductive adhesive layer 120 and the under bump metallurgy layer 520, in accordance with some embodiments. In some embodiments, the conductive bumps 530 are formed from the solder structures 140 and 530a in FIGS. 1E and 5A.

In some embodiments, a thickness T1 of the conductive adhesive layer 120 is substantially equal to a thickness T2 of the under bump metallurgy layer 520. The thickness T1 ranges from about 0.5 µm to about 2 µm, in accordance with some embodiments. The thickness T2 ranges from about 0.5 µm to about 2 µm, in accordance with some embodiments.

The term "substantially equal to" in the application means "within 10%", in accordance with some embodiments. For example, the term "substantially equal to" means the difference between the thicknesses T1 and T2 is within 10% of the average thickness between the under bump metallurgy layer 520 and the conductive adhesive layer 120, in accordance with some embodiments. The difference may be due to manufacturing processes.

Since the thickness T1 is substantially equal to the thickness T2, the tensile stress applied by the conductive adhesive layer 120 to the conductive bumps 530 is substantially equal to the tensile stress applied by the under bump metallurgy layer 520 to the conductive bumps 530, in accordance with some embodiments. As a result, in the conductive bumps 530, the tensile stresses applied by the conductive adhesive layer 120 and the under bump metallurgy layer 520 are substantially balanced, in accordance with some embodiments.

The tensile stress balance prevents the conductive bumps 530 from developing cracks, in accordance with some embodiments. Therefore, the yield of the conductive bumps 530 is improved, in accordance with some embodiments. The yield of a chip package structure with the conductive adhesive layer 120, the under bump metallurgy layer 520, and the conductive bumps 530 is also improved, in accordance with some embodiments.

As shown in FIG. 5B, an underfill layer U is formed between the chip 510 and the wiring substrate 110, in accordance with some embodiments. The underfill layer U surrounds the conductive bumps 530, in accordance with some embodiments. The underfill layer U includes an insulating material, such as a polymer material, in accordance with some embodiments.

As shown in FIG. 5B, an adhesive layer 540 is formed over the wiring substrate 110, in accordance with some embodiments. The adhesive layer 540 surrounds the chip 510 and the underfill layer U, in accordance with some embodiments. The adhesive layer 540 has a ring shape, in accordance with some embodiments. The adhesive layer 540 is made of polymer, such as epoxy or silicone, in accordance with some embodiments. The adhesive layer 540 is formed using a dispensing process, in accordance with some embodiments.

As shown in FIG. 5B, an adhesive layer 541 is formed over the chip 510, in accordance with some embodiments. The adhesive layer 541 is made of a silver paste, a tin paste, a mixture of metal powder and polymer, or another suitable adhesive material with good thermal conductivity, in accordance with some embodiments. The adhesive layer 541 is formed using a dispensing process, in accordance with some embodiments.

As shown in FIG. 5B, a heat-spreading lid 550 is disposed over the chip 510 and the adhesive layers 540 and 541, in accordance with some embodiments. The heat-spreading lid 550 is made of a high thermal conductivity material, such as a metal material (aluminum or copper), an alloy material (e.g., stainless steel), or aluminum-silicon carbide (AlSiC), in accordance with some embodiments. In some other embodiments, the adhesive layers 540 and 541 are formed over the heat-spreading lid 550 firstly, and then the heat-spreading lid 550 and the adhesive layers 540 and 541 are disposed over the chip 510 and the wiring substrate 110.

Figure 5C:
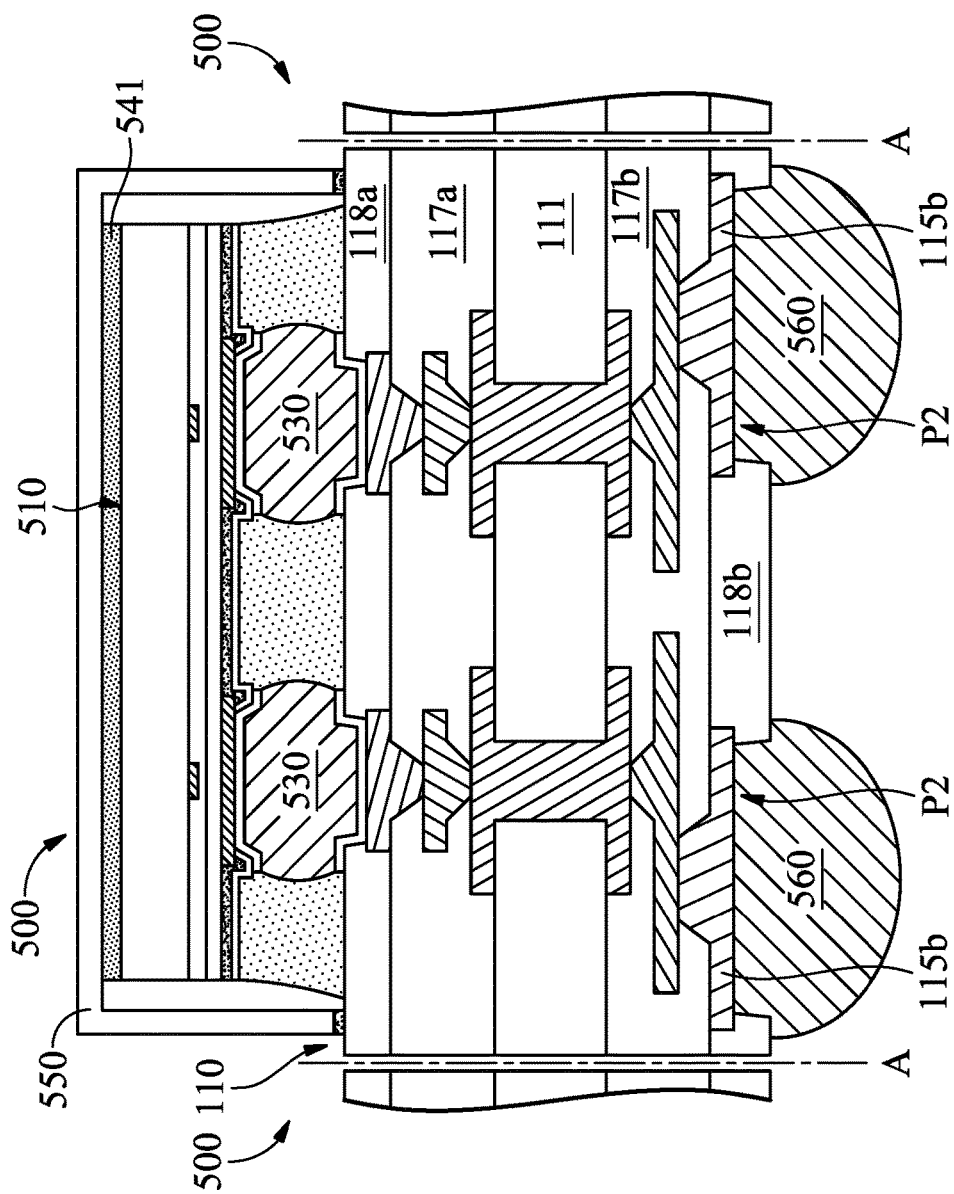

As shown in FIG. 5C, conductive bumps 560 are formed over the pads 115b and in the openings P2, in accordance with some embodiments. The conductive bumps 560 are made of a suitable solder material, such as tin (Sn) or tin alloy, in accordance with some embodiments.

As shown in FIG. 5C, a cutting process is performed over the wiring substrate 110 along cutting lines A to cut through the wiring substrate 110 to form chip package structures 500, in accordance with some embodiments.

Figure 5D:
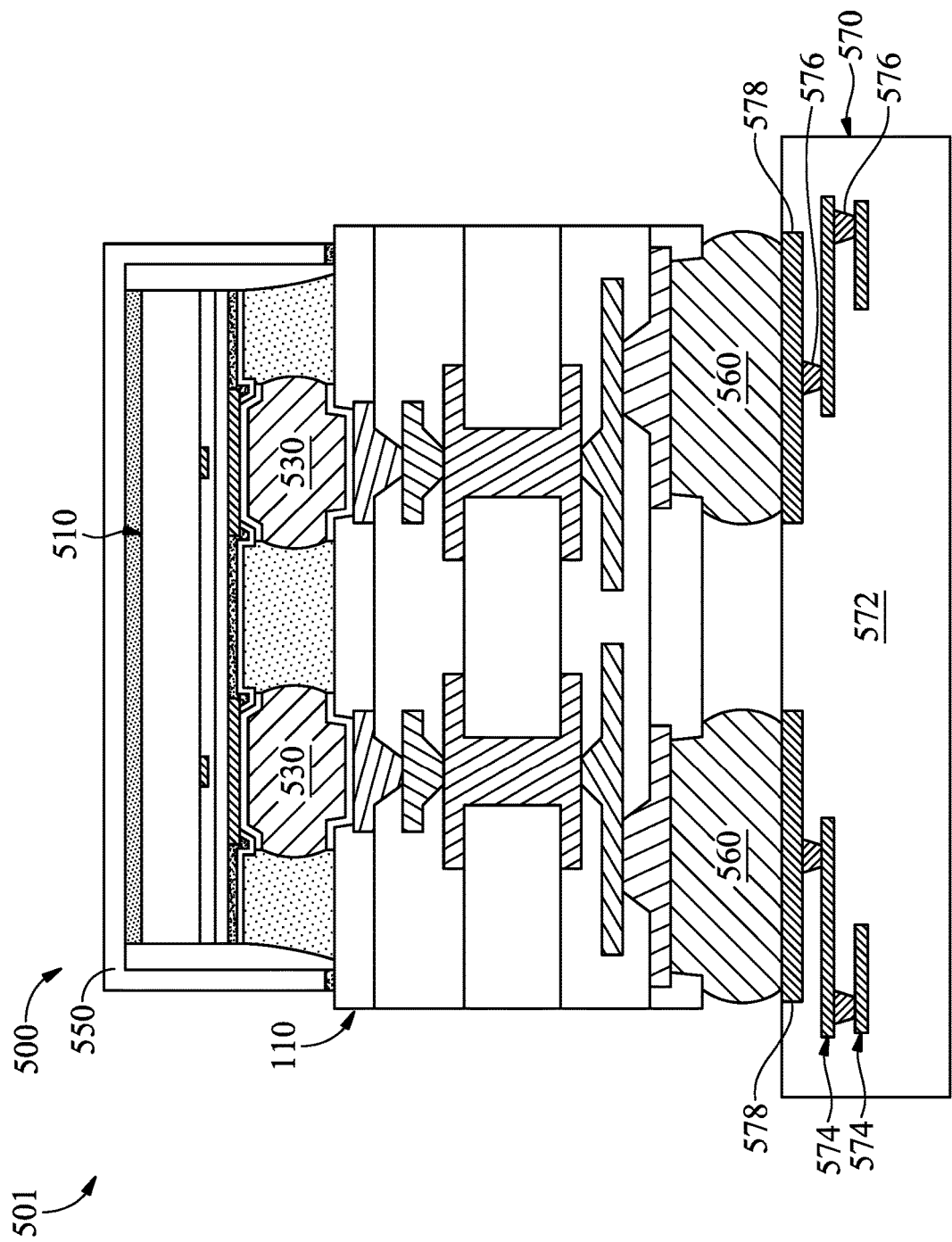

As shown in FIG. 5D, the chip package structure 500 is bonded to a wiring substrate 570 through the conductive bumps 560, in accordance with some embodiments. The wiring substrate 570 includes an insulating layer 572, wiring layers 574, conductive vias 576, and pads 578, in accordance with some embodiments.

The wiring layers 574 and the conductive vias 576 are in the insulating layer 572, in accordance with some embodiments. The pads 578 are over the insulating layer 572, in accordance with some embodiments. The conductive vias 576 are electrically connected between the wiring layers 574 and between the wiring layer 574 and the pads 578, in accordance with some embodiments.

The wiring layers 574, the conductive vias 576, and the pads 578 are made of a conductive material such as a metal material or an alloy thereof, in accordance with some embodiments. The metal material includes aluminum, copper or tungsten.

In this step, a chip package structure (or board-level package structure) 501 is substantially formed, in accordance with some embodiments. The chip package structure 501 includes the chip package structure 500, the conductive bumps 560, and the wiring substrate 570, in accordance with some embodiments. The chip package structure 501 is a ball grid array (BGA) package structure, in accordance with some embodiments.

Figure 6A:
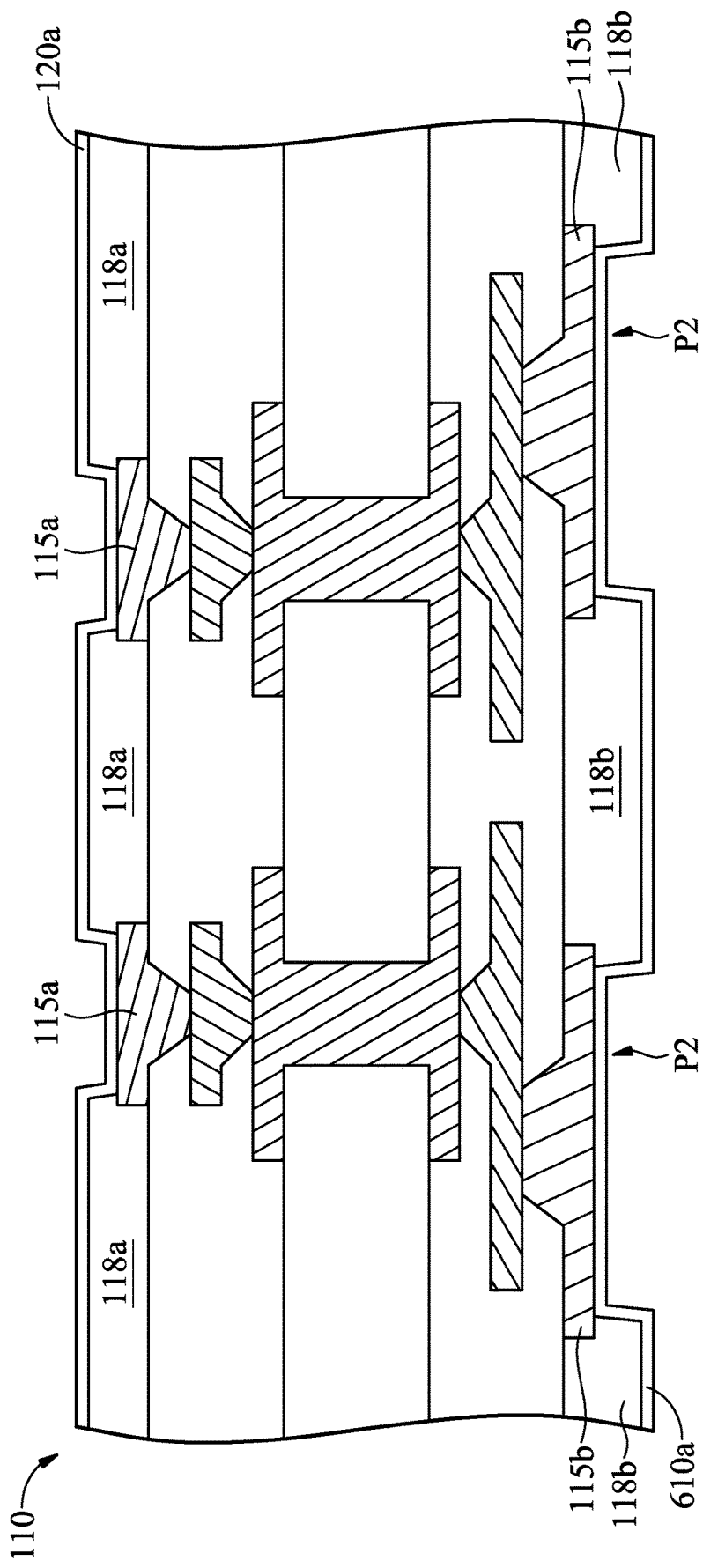
FIGS. 6A-6E are cross-sectional views of various stages of a process for forming a chip package structure, in accordance with some embodiments.

FIGS. 6A-6E are cross-sectional views of various stages of a process for forming a chip package structure, in accordance with some embodiments. As shown in FIG. 6A, the step of FIG. 6A is similar to the step of FIG. 1A, except that the step of FIG. 6A further forms a conductive adhesive material layer 610a over the polymer layer 118b and the pads 115b during forming the conductive adhesive material layer 120a over the polymer layer 118a and the pads 115a, in accordance with some embodiments.

In some embodiments, the conductive adhesive material layers 120a and 610a are made of the same material. The conductive adhesive material layer 610a is made of nickel (Ni), titanium (Ti), copper (Cu), palladium (Pd), an alloy thereof, a combination thereof, or another suitable metal or alloy, in accordance with some embodiments. The conductive adhesive material layer 610a is formed using a deposition process, such as an electroless plating process, in accordance with some embodiments.

In some other embodiments (not shown), the conductive adhesive material layers 120a and 610a are formed in different processes. The conductive adhesive material layers 120a and 610a are made of different materials, in accordance with some embodiments.

Figure 6B:
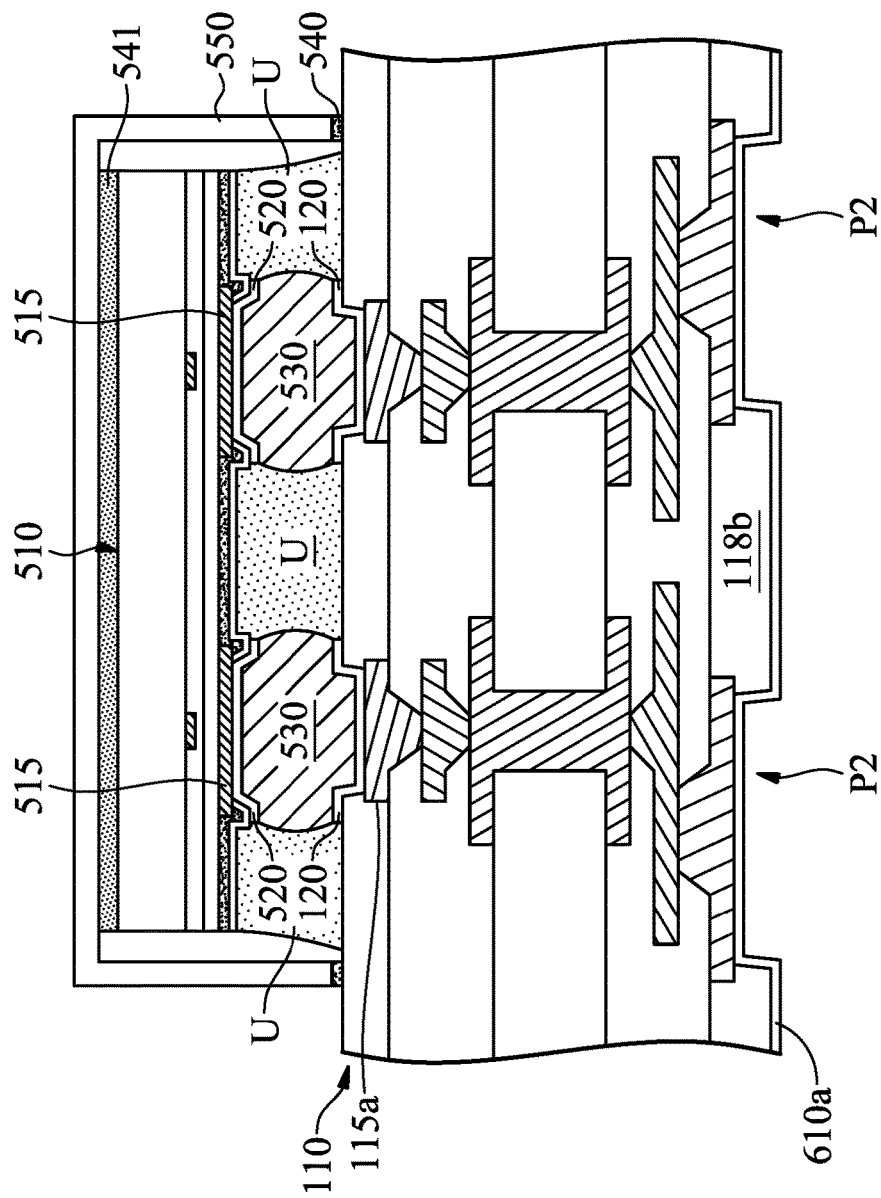

As shown in FIG. 6B, the steps of FIGS. 1B-1E and 5A-5B are performed to form the conductive adhesive layer 120, the chip 510, the under bump metallurgy layer 520, the conductive bumps 530, the underfill layer U, the adhesive layer 540, and the heat-spreading lid 550 over the wiring substrate 110, in accordance with some embodiments.

Figure 6C:
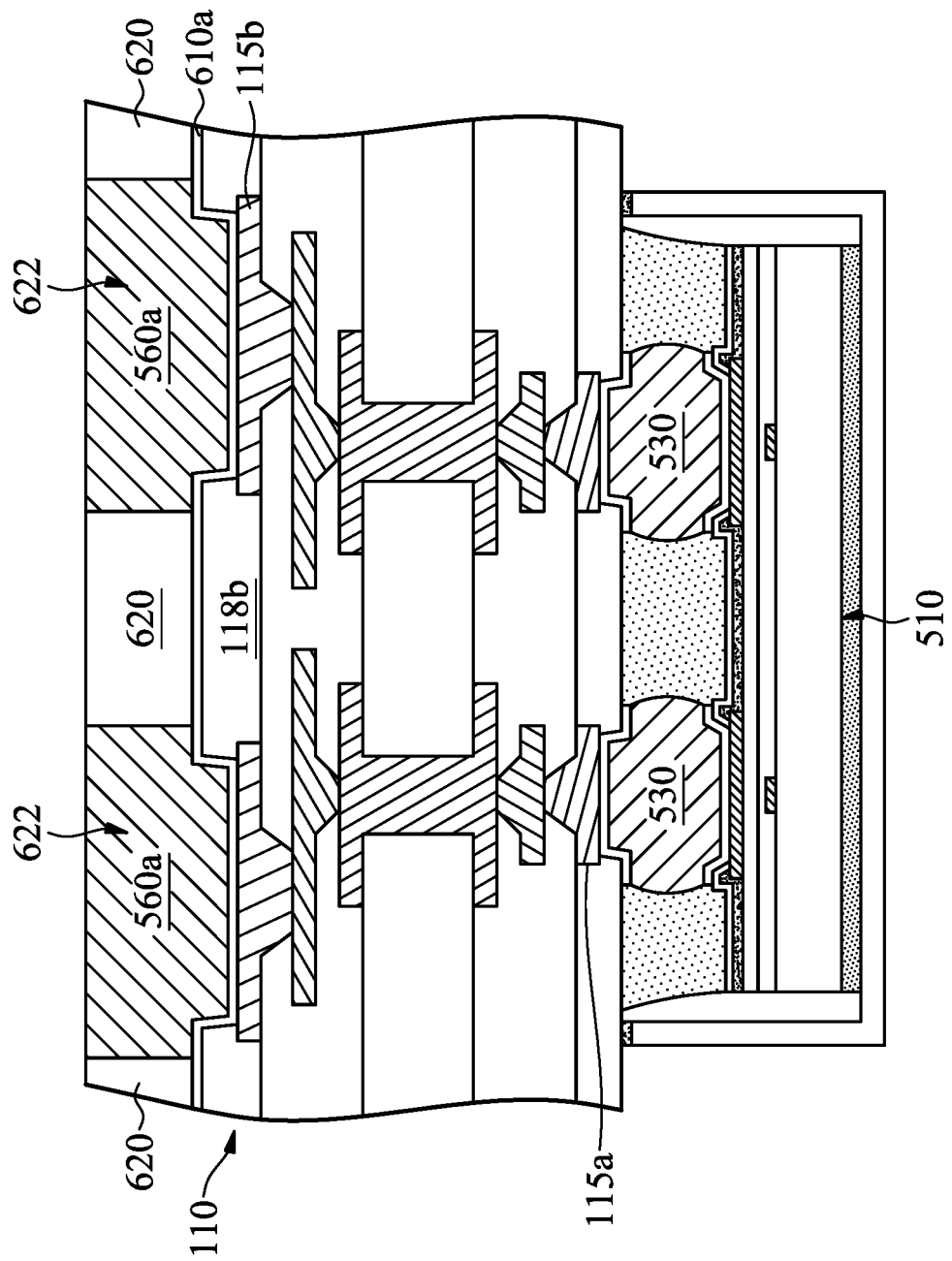

As shown in FIG. 6C, the wiring substrate 110 is flipped upside down, in accordance with some embodiments. As shown in FIG. 6C, a mask layer 620 is formed over the conductive adhesive material layer 610a, in accordance with some embodiments. The mask layer 620 has openings 622, in accordance with some embodiments. The openings 622 expose the conductive adhesive material layer 610a over or adjacent to the pads 115b, in accordance with some embodiments. The mask layer 620 is made of a photoresist material, such as a polymer material, in accordance with some embodiments.

As shown in FIG. 6C, a solder layer 560a is formed in the openings 622, in accordance with some embodiments. The solder layer 560a is formed over the conductive adhesive material layer 610a, in accordance with some embodiments. The solder layer 560a is in direct contact with the conductive adhesive material layer 610a, in accordance with some embodiments.

The solder layer 560a is made of a suitable solder material, such as tin (Sn) or tin alloy, in accordance with some embodiments. The solder layer 560a is formed using a plating process, such as an electroplating process, in accordance with some embodiments. The conductive adhesive material layer 610a is used as a seed layer in the electroplating process, in accordance with some embodiments.

Figure 6D:
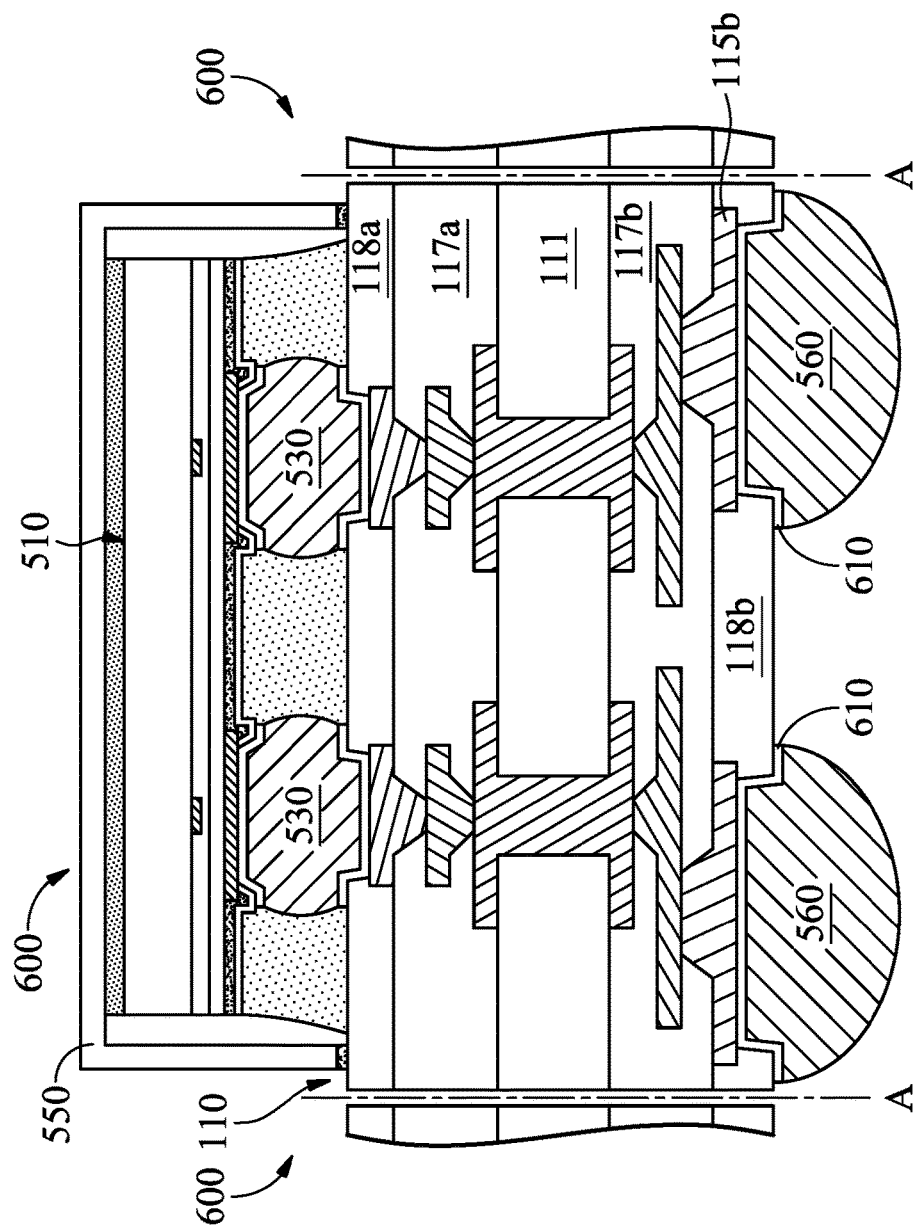

As shown in FIGS. 6C-6D, the mask layer 620 and the conductive adhesive material layer 610a under the mask layer 620 are removed, in accordance with some embodiments. The conductive adhesive material layer 610a remaining under the solder layer 560a forms a conductive adhesive layer 610, in accordance with some embodiments.

As shown in FIG. 6D, a reflow process is performed over the solder layer 560a, in accordance with some embodiments. The reflowed solder layer 560a forms conductive bumps 560, in accordance with some embodiments. The conductive bumps 560 have ball-like shapes, in accordance with some embodiments.

As shown in FIG. 6D, a cutting process is performed over the wiring substrate 110 along cutting lines A to cut through the wiring substrate 110 to form chip package structures 600, in accordance with some embodiments.

Figure 6E:
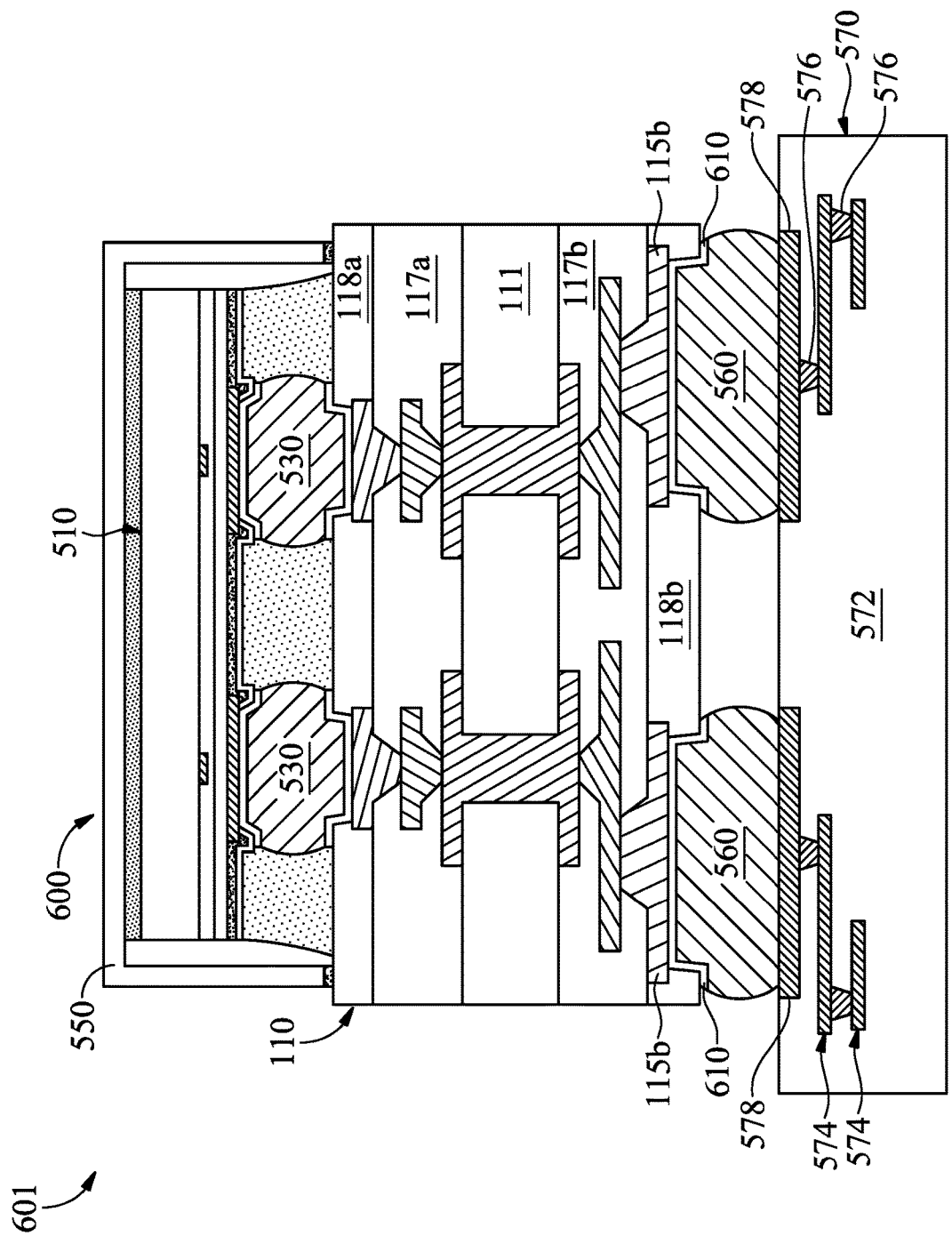

As shown in FIG. 6E, the chip package structure 600 is bonded to a wiring substrate 570 through the conductive bumps 560, in accordance with some embodiments.

The wiring substrate 570 includes an insulating layer 572, wiring layers 574, conductive vias 576, and pads 578, in accordance with some embodiments.

The wiring layers 574 and the conductive vias 576 are in the insulating layer 572, in accordance with some embodiments. The pads 578 are over the insulating layer 572, in accordance with some embodiments. The conductive vias 576 are electrically connected between the wiring layers 574 and between the wiring layer 574 and the pads 578, in accordance with some embodiments.

The wiring layers 574, the conductive vias 576, and the pads 578 are made of a conductive material such as a metal material or an alloy thereof, in accordance with some embodiments. The metal material includes aluminum, copper or tungsten.

In this step, a chip package structure (or board-level package structure) 601 is substantially formed, in accordance with some embodiments. The chip package structure 601 includes the chip package structure 600, the conductive bumps 560, and the wiring substrate 570, in accordance with some embodiments.

In some embodiments, as shown in FIGS. 6A-6D, the conductive adhesive layer 610 is formed by depositing the conductive adhesive material layer 610a and removing the conductive adhesive material layer 610a under the mask layer 620. In some other embodiments (e.g., embodiments of FIGS. 7A-7B), the conductive adhesive layer 610 is formed by depositing the conductive adhesive material layer 610a and removing the conductive adhesive material layer 610a exposed by a mask layer.

Figure 7A:
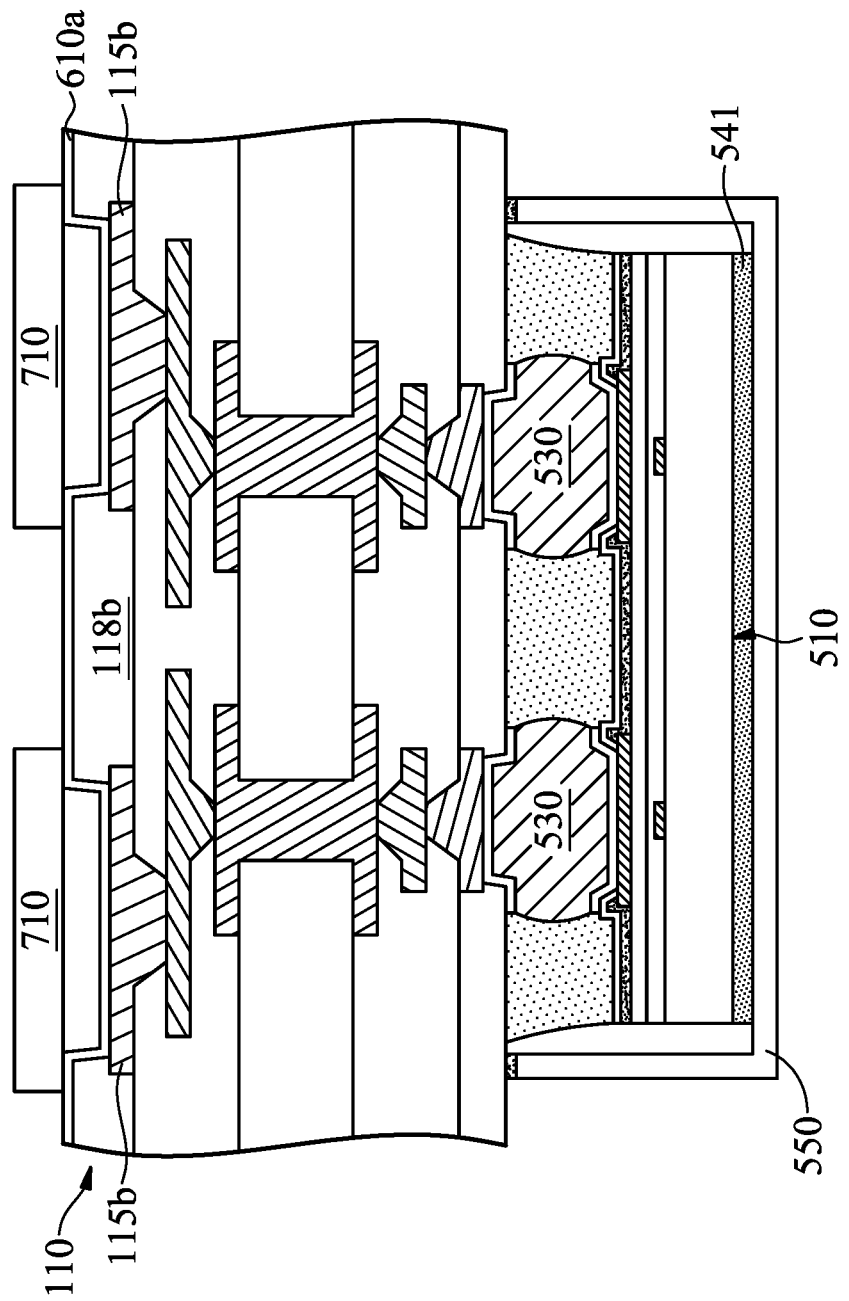
FIGS. 7A-7C are cross-sectional views of various stages of a process for forming a chip package structure, in accordance with some embodiments.
Figure 7B:
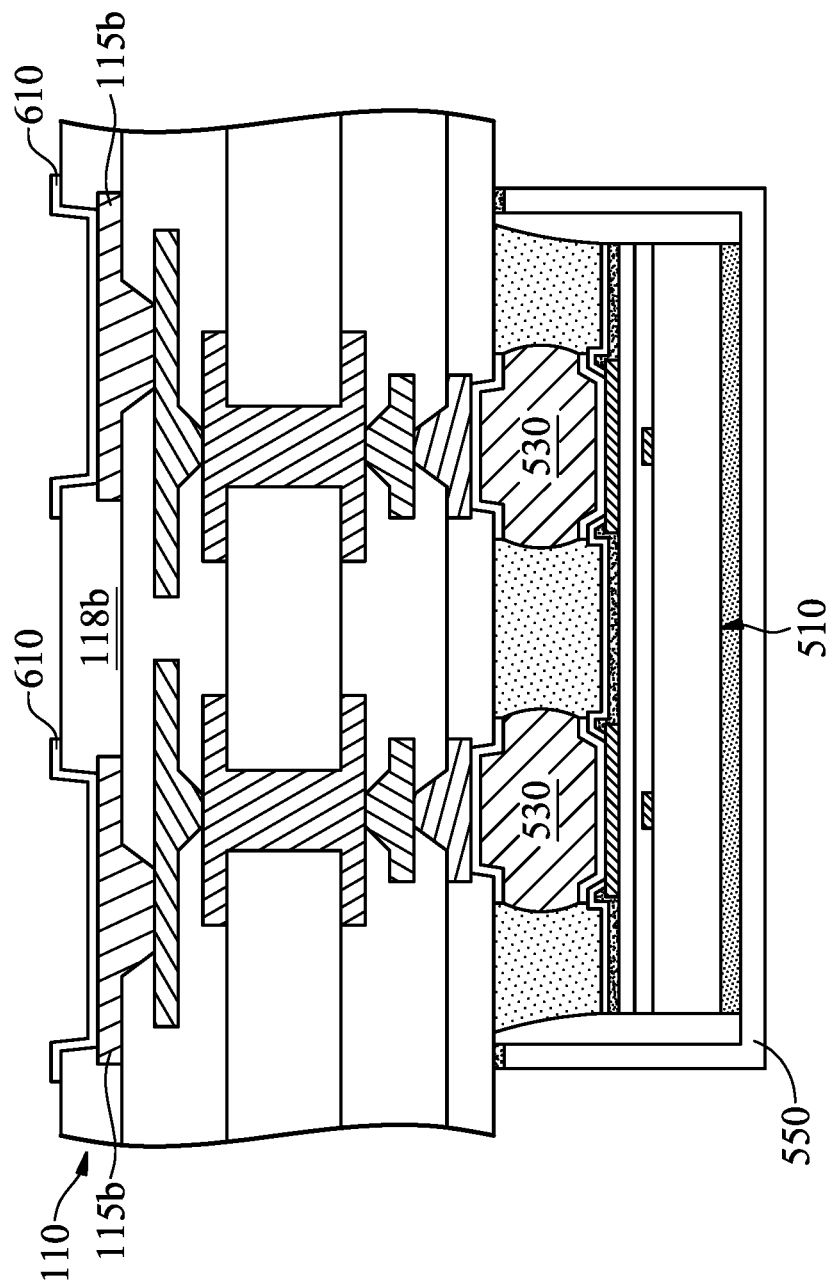
Figure 7C:
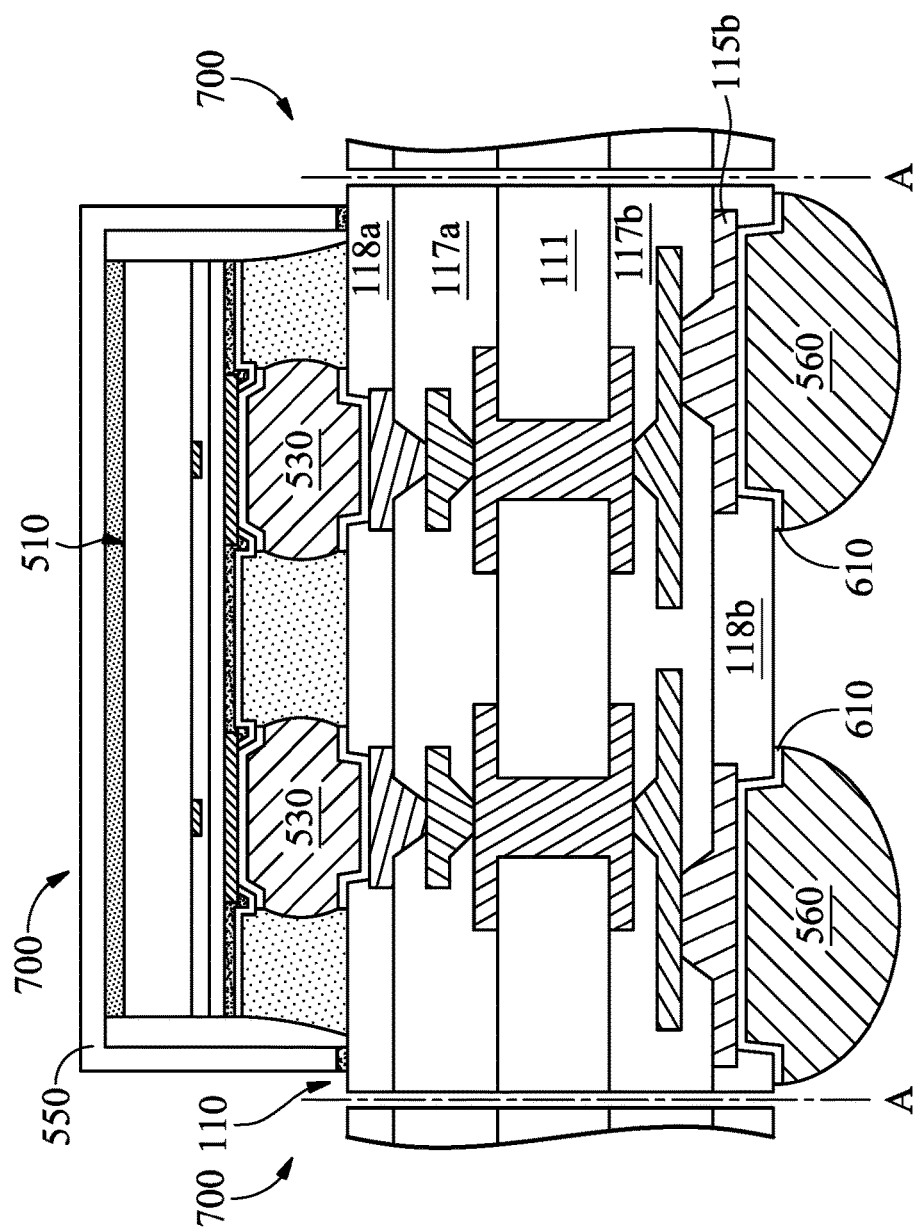

FIGS. 7A-7C are cross-sectional views of various stages of a process for forming a chip package structure, in accordance with some embodiments. As shown in FIG. 7A, after the step of FIG. 6B, the wiring substrate 110 is flipped upside down, in accordance with some embodiments. As shown in FIG. 7A, a mask layer 710 is formed over the conductive adhesive material layer 610a over or adjacent to the pads 115b, in accordance with some embodiments. The mask layer 710 is also referred to as a dry film, in accordance with some embodiments. The mask layer 710 is made of a polymer material, in accordance with some embodiments.

As shown in FIGS. 7A-7B, the conductive adhesive material layer 610a exposed by the mask layer 710 is removed, in accordance with some embodiments. The conductive adhesive material layer 610a remaining under the mask layer 710 forms a conductive adhesive layer 610, in accordance with some embodiments. As shown in FIG. 7B, the mask layer 710 is removed, in accordance with some embodiments.

Thereafter, as shown in FIG. 7C, conductive bumps 560 are formed over the conductive adhesive layer 610, in accordance with some embodiments. The conductive bumps 560 are formed using a printing process (similar to the printing process of FIG. 3C) or a ball mounting process (similar to the ball mounting process of FIG. 4) and a reflow process, in accordance with some embodiments.

As shown in FIG. 7C, a cutting process is performed over the wiring substrate 110 along cutting lines A to cut through the wiring substrate 110 to form chip package structures 700, in accordance with some embodiments.

Figure 8A:
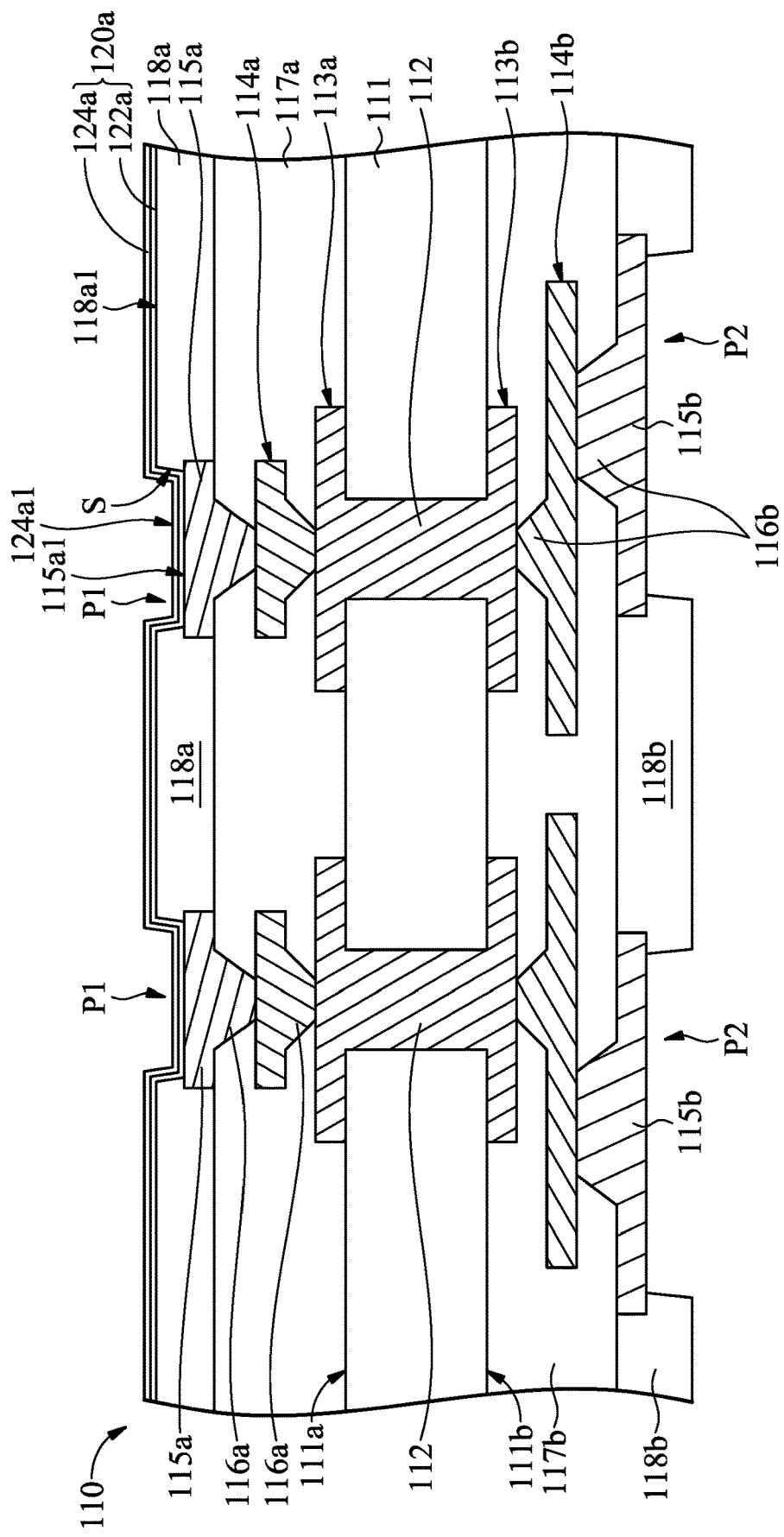
FIGS. 8A-8D are cross-sectional views of various stages of a process for forming a chip package structure, in accordance with some embodiments.

FIGS. 8A-8D are cross-sectional views of various stages of a process for forming a chip package structure, in accordance with some embodiments. As shown in FIG. 8A, a wiring substrate 110 is provided, in accordance with some embodiments. As shown in FIG. 8A, a material layer 122a is formed over the polymer layer 118a and the pads 115a, in accordance with some embodiments.

The material layer 122a conformally covers a top surface 118a1 of the polymer layer 118a, inner walls S of openings P1 of the polymer layer 118a, and top surfaces 115a1 of the pads 115a, in accordance with some embodiments. The material layer 122a is in direct contact with the polymer layer 118a and the pads 115a, in accordance with some embodiments.

As shown in FIG. 8A, a material layer 124a is formed over the material layer 122a, in accordance with some embodiments. The material layer 124a conformally covers the material layer 122a, in accordance with some embodiments. The material layer 124a has recesses 124a1 in the openings P1, in accordance with some embodiments. The material layers 122a and 124a are made of different materials, in accordance with some embodiments. The material layer 122a is made of titanium or palladium, in accordance with some embodiments. The material layer 124a is made of copper, in accordance with some embodiments.

In some embodiments, the material layer 122a is made of titanium, the material layer 124a is made of copper, and the material layers 122a and 124a are formed using a sputtering process. In some embodiments, the material layer 122a is made of palladium, the material layer 124a is made of copper, and the material layers 122a and 124a are formed using an electroless plating process. The material layers 122a and 124a together form a conductive adhesive material layer 120a, in accordance with some embodiments.

Figure 8B:
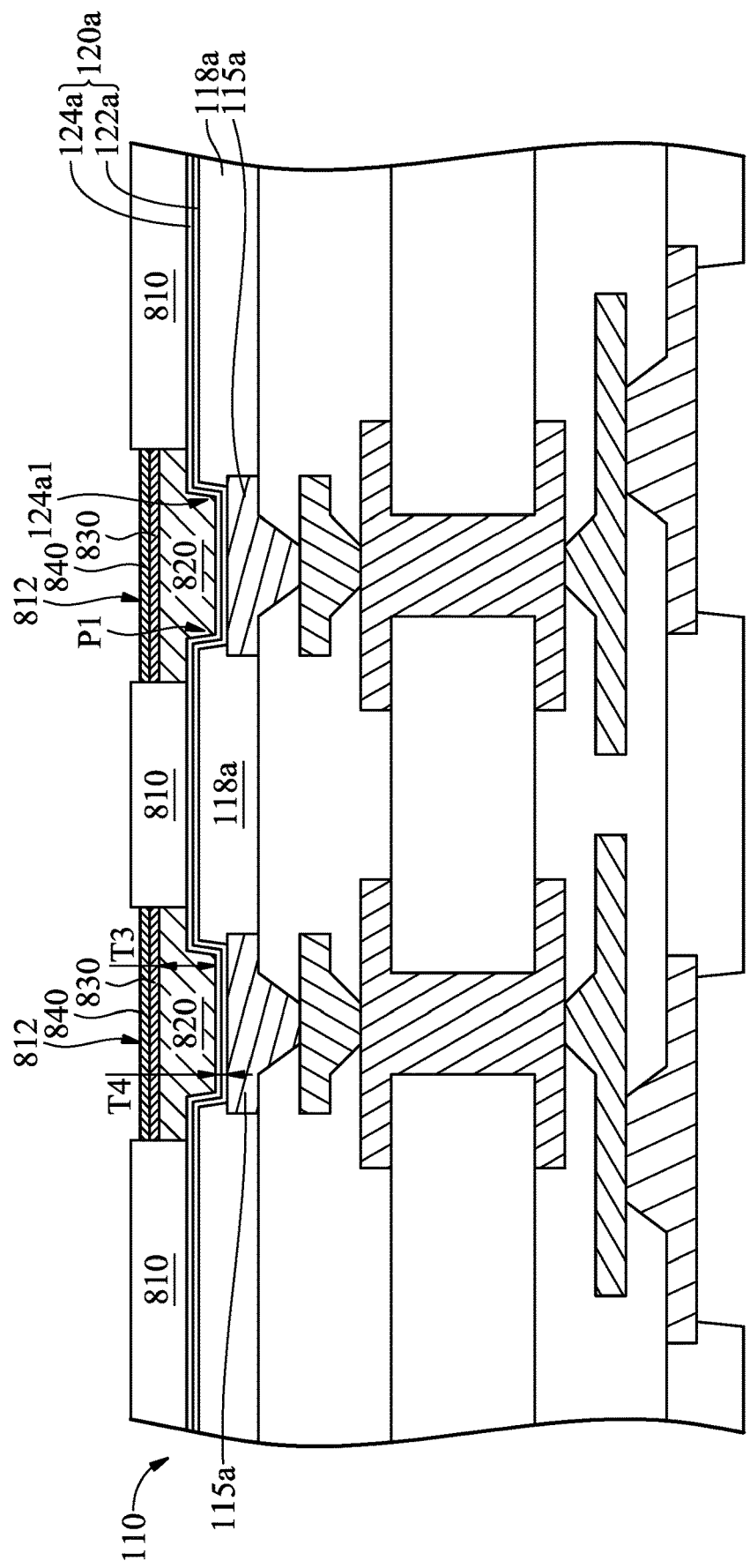

As shown in FIG. 8B, a mask layer 810 is formed over the material layer 124a, in accordance with some embodiments. The mask layer 810 has openings 812 exposing the material layer 124a over or adjacent to the pads 115a, in accordance with some embodiments. The mask layer 810 is made of a photoresist material, such as a polymer material, in accordance with some embodiments.

As shown in FIG. 8B, a nickel layer 820 is formed in the openings 812 and the recesses 124a1, in accordance with some embodiments. The recesses 124a1 is filled with the nickel layer 820, in accordance with some embodiments. The nickel layer 820 is thicker than the conductive adhesive material layer 120a, in accordance with some embodiments. That is, a thickness T3 of the nickel layer 820 is greater than a thickness T4 of the conductive adhesive material layer 120a, in accordance with some embodiments.

The thickness T3 ranges from about 3 μm to about 30 μm, in accordance with some embodiments. The thickness T4 ranges from about 0.5 μm to about 2 μm, in accordance with some embodiments.

The nickel layer 820 may prevent copper of the pads 115a from migrating into conductive bumps, which are subsequently formed over the nickel layer 820, during subsequent high current density operations. Therefore, the nickel layer 820 may reduce electromigration issues.

The nickel layer 820 is made of nickel or an alloy thereof, in accordance with some embodiments. The material layers 122a and 124a and the nickel layer 820 are made of different materials, in accordance with some embodiments. The nickel layer 820 is formed using a plating process such as an electroless plating process, in accordance with some embodiments.

As shown in FIG. 8B, a palladium layer 830 is formed over the nickel layer 820, in accordance with some embodiments. The palladium layer 830 is thinner than the nickel layer 820, in accordance with some embodiments. The palladium layer 830 is made of palladium or an alloy thereof, in accordance with some embodiments. The palladium layer 830 is formed using a plating process such as an electroless plating process, in accordance with some embodiments.

As shown in FIG. 8B, a gold layer 840 is formed over the palladium layer 830, in accordance with some embodiments. The gold layer 840 is thinner than the nickel layer 820, in accordance with some embodiments. The gold layer 840 is made of gold or an alloy thereof, in accordance with some embodiments. The gold layer 840 is formed using a plating process such as an immersion plating process, in accordance with some embodiments.

Figure 8C:
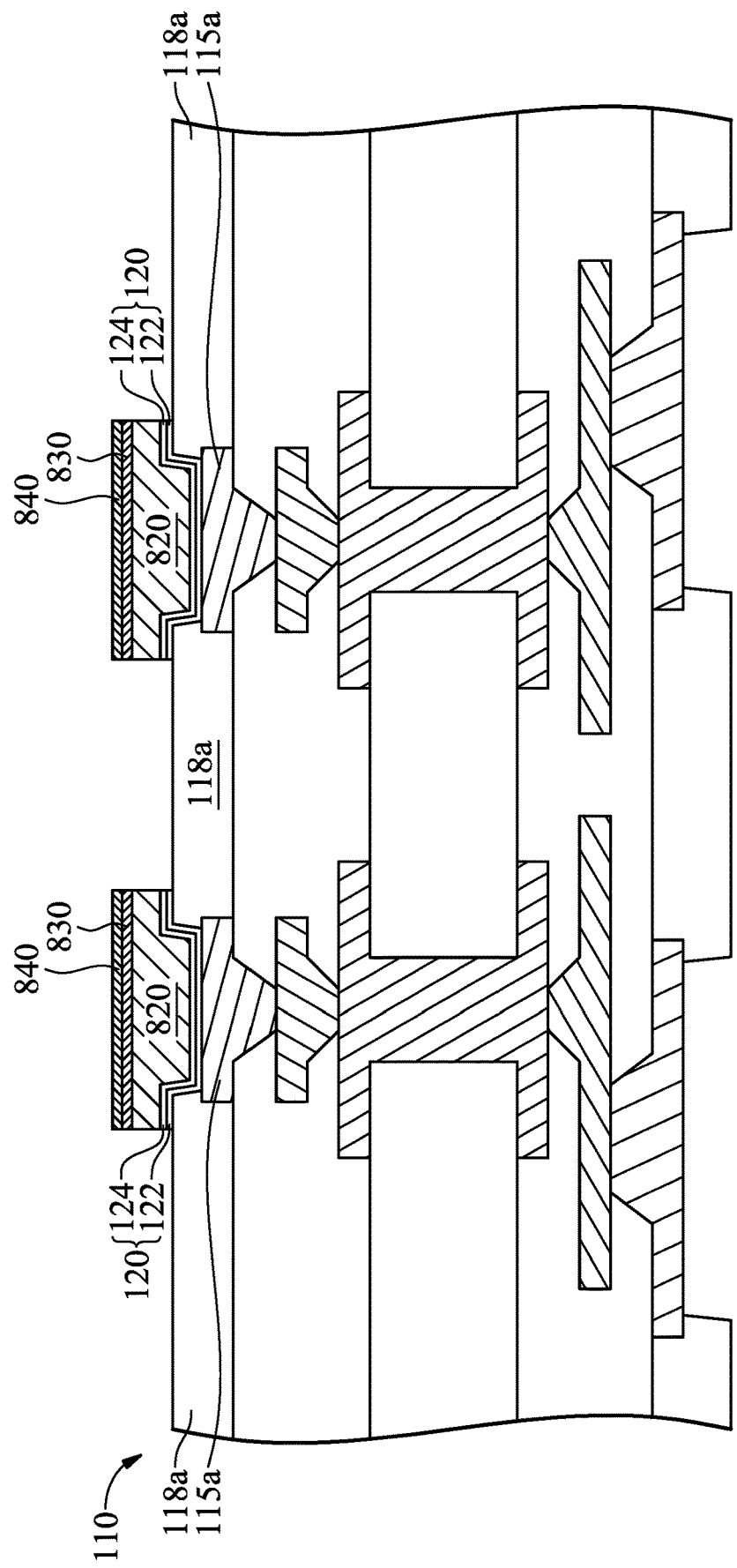

As shown in FIG. 8C, the mask layer 810 and the material layers 122a and 124a under the mask layer 810 are removed, in accordance with some embodiments. The material layer 122a remaining under the nickel layer 820 forms a layer 122, in accordance with some embodiments. The material layer 124a remaining under the nickel layer 820 forms a layer 124, in accordance with some embodiments. The layers 122 and 124 together form a conductive adhesive layer 120, in accordance with some embodiments.

Figure 8D:
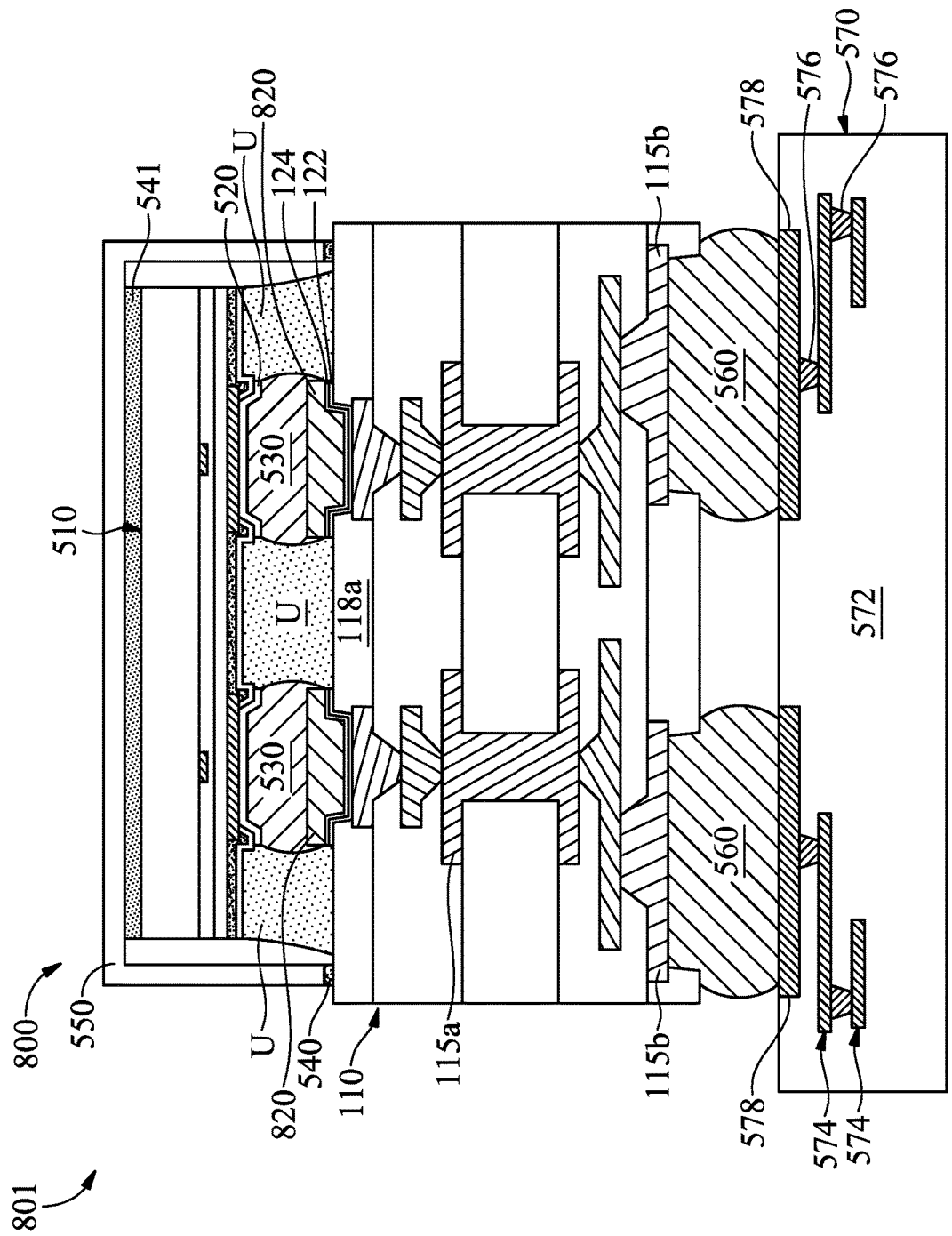

As shown in FIGS. 8C-8D, the steps of FIGS. 1D-1E and 5A-5B are performed to form the chip 510, the under bump metallurgy layer 520, the conductive bumps 530, the underfill layer U, the adhesive layer 540, and the heat-spreading lid 550 over the wiring substrate 110, in accordance with some embodiments. The palladium layer 830 and the gold layer 840 are dispersed (or dissolved) in the conductive bumps 530 after bonding the chip 510 to the wiring substrate 110, in accordance with some embodiments. The conductive bumps 530 are in direct contact with the nickel layer 820, in accordance with some embodiments.

As shown in FIG. 8D, the step of FIG. 5C is performed to form conductive bumps 560 over the pads 115b and form chip package structures 800, in accordance with some embodiments. For the sake of simplicity, FIG. 8D only shows one of the chip package structures 800, in accordance with some embodiments.

As shown in FIG. 8D, the step of FIG. 5D is performed to bond the wiring substrate 110 to a wiring substrate 570 through the conductive bumps 560, in accordance with some embodiments. The conductive bumps 560 are between the pads 115b of the wiring substrate 110 and the pads 578 of the wiring substrate 570, in accordance with some embodiments.

In this step, a chip package structure (or board-level package structure) 801 is substantially formed, in accordance with some embodiments. The chip package structure 801 includes the chip package structure 800, the conductive bumps 560, and the wiring substrate 570, in accordance with some embodiments. The chip package structure 801 is a ball grid array (BGA) package structure, in accordance with some embodiments.

Figure 9A:
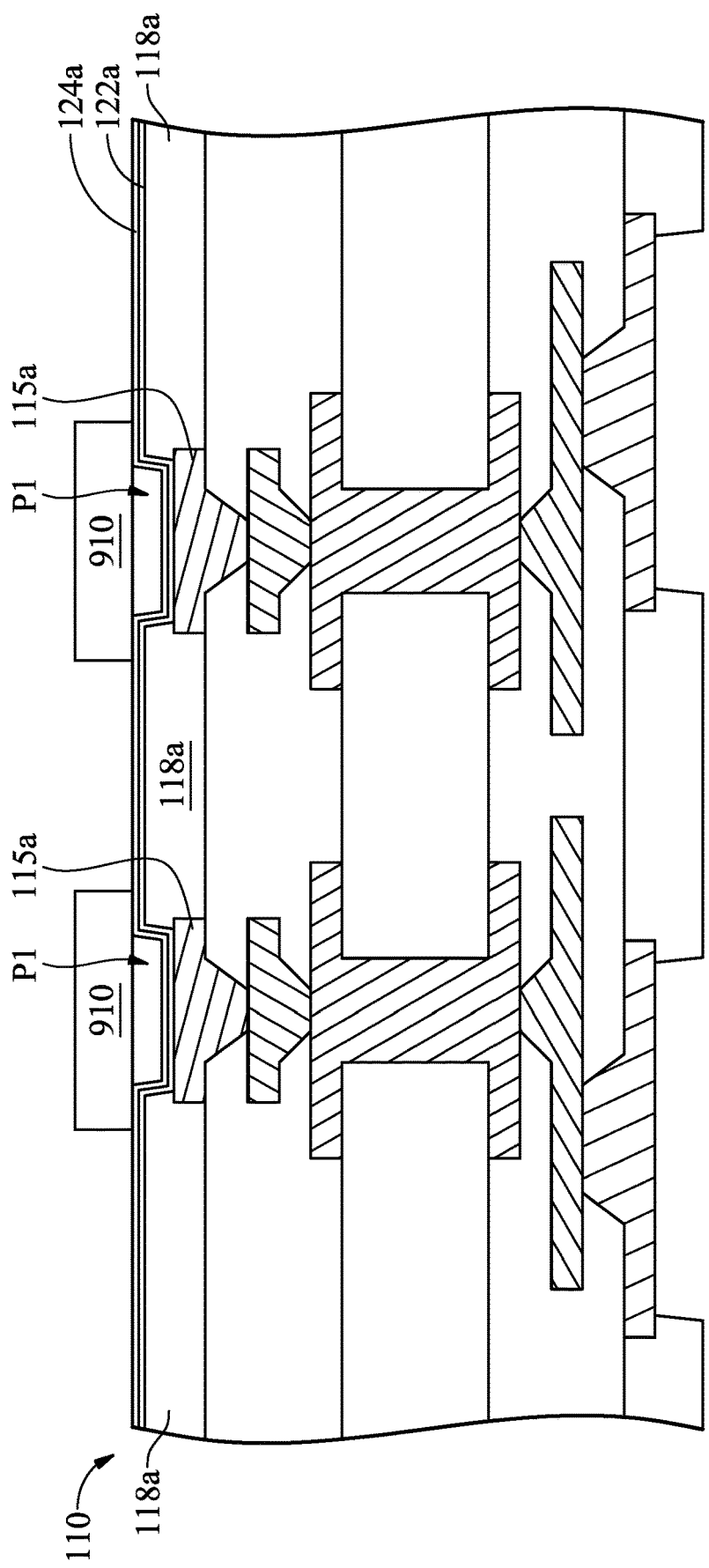
FIGS. 9A-9C are cross-sectional views of various stages of a process for forming a chip package structure, in accordance with some embodiments.
Figure 9B:
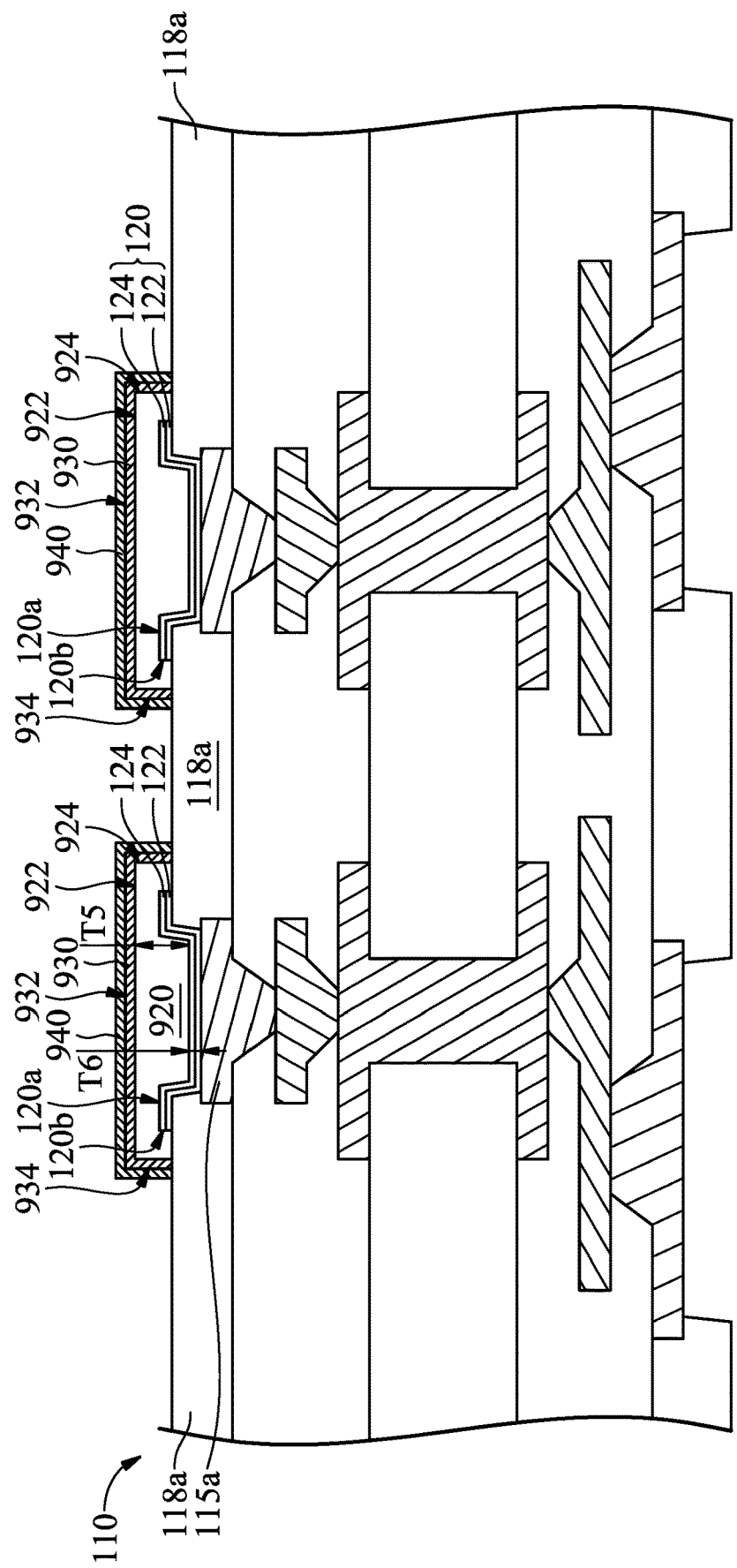
Figure 9C:
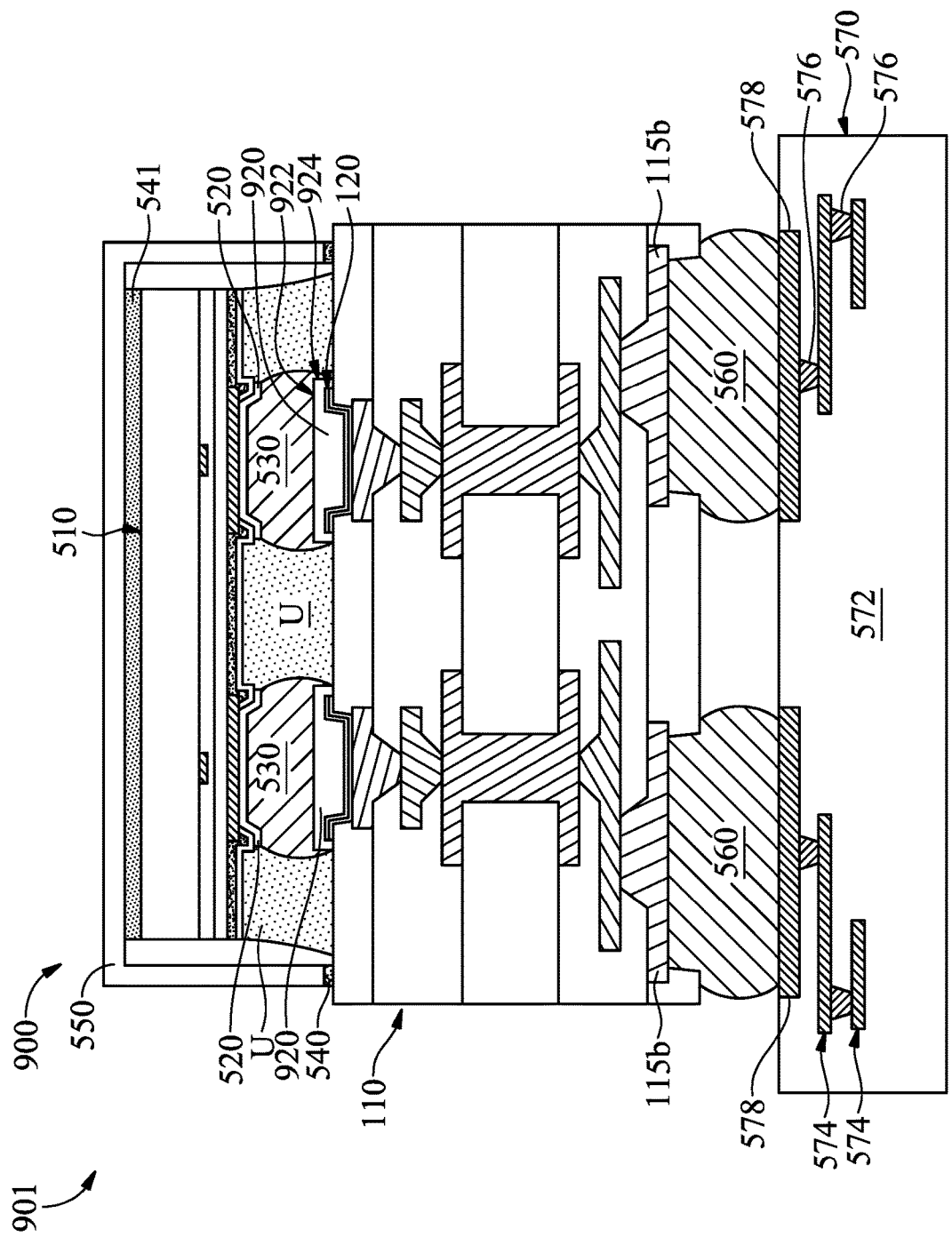

FIGS. 9A-9C are cross-sectional views of various stages of a process for forming a chip package structure, in accordance with some embodiments. As shown in FIG. 9A, after the step of FIG. 8A, a mask layer 910 is formed over the material layer 124a over or adjacent to the pads 115a, in accordance with some embodiments. The mask layer 910 is also referred to as a dry film, in accordance with some embodiments. The mask layer 910 is made of a polymer material, in accordance with some embodiments.

As shown in FIGS. 9A-9B, the material layers 122a and 124a, which are not covered by the mask layer 910, are removed, in accordance with some embodiments. The material layer 122a remaining under the mask layer 910 forms a layer 122, in accordance with some embodiments. The material layer 124a remaining under the mask layer 910 forms a layer 124, in accordance with some embodiments. The layers 122 and 124 together form a conductive adhesive layer 120, in accordance with some embodiments. As shown in FIG. 9B, the mask layer 910 is removed, in accordance with some embodiments.

As shown in FIG. 9B, a nickel layer 920 is formed over the conductive adhesive layer 120, in accordance with some embodiments. The nickel layer 920 covers a top surface 120a and a sidewall 120b of the conductive adhesive layer 120, in accordance with some embodiments.

The nickel layer 920 is thicker than the conductive adhesive layer 120, in accordance with some embodiments. That is, a thickness T5 of the nickel layer 920 is greater than a thickness T6 of the conductive adhesive layer 120, in accordance with some embodiments. The thickness T5 ranges from about 3 µm to about 30 µm, in accordance with some embodiments. The thickness T6 ranges from about 0.5 µm to about 2 µm, in accordance with some embodiments.

The nickel layer 920 is made of nickel or an alloy thereof, in accordance with some embodiments. The nickel layer 920 is formed using a plating process such as an electroless plating process, in accordance with some embodiments.

As shown in FIG. 9B, a palladium layer 930 is formed over the nickel layer 920, in accordance with some embodiments. The palladium layer 930 conformally covers a top surface 922 and sidewalls 924 of the nickel layer 920, in accordance with some embodiments. The palladium layer 930 is thinner than the nickel layer 920, in accordance with some embodiments.

The palladium layer 930 is made of palladium or an alloy thereof, in accordance with some embodiments. The palladium layer 930 is formed using a plating process such as an electroless plating process, in accordance with some embodiments.

As shown in FIG. 9B, a gold layer 940 is formed over the palladium layer 930, in accordance with some embodiments. The gold layer 940 conformally covers a top surface 932 and sidewalls 934 of the palladium layer 930, in accordance with some embodiments. The gold layer 940 is thinner than the nickel layer 920, in accordance with some embodiments. The gold layer 940 is made of gold or an alloy thereof, in accordance with some embodiments. The gold layer 940 is formed using a plating process such as an immersion plating process, in accordance with some embodiments.

As shown in FIGS. 9B-9C, the steps of FIGS. 5A-5B are performed to form the chip 510, the under bump metallurgy layer 520, the conductive bumps 530, the underfill layer U, the adhesive layer 540, and the heat-spreading lid 550 over the wiring substrate 110, in accordance with some embodiments. The palladium layer 930 and the gold layer 940 are dissolved in the conductive bumps 530 after bonding the chip 510 to the wiring substrate 110, in accordance with some embodiments.

As shown in FIG. 9C, the step of FIG. 5C is performed to form conductive bumps 560 over the pads 115b and form chip package structures 900, in accordance with some embodiments. For the sake of simplicity, FIG. 9C only shows one of the chip package structures 900, in accordance with some embodiments.

As shown in FIG. 9C, the step of FIG. 5D is performed to bond the wiring substrate 110 to a wiring substrate 570 through the conductive bumps 560, in accordance with some embodiments. The conductive bumps 560 are between the pads 115b of the wiring substrate 110 and the pads 578 of the wiring substrate 570, in accordance with some embodiments.

In this step, a chip package structure (or board-level package structure) 901 is substantially formed, in accordance with some embodiments. The chip package structure 901 includes the chip package structure 900, the conductive bumps 560, and the wiring substrate 570, in accordance with some embodiments. The chip package structure 901 is a ball grid array (BGA) package structure, in accordance with some embodiments.

Figure 10A:
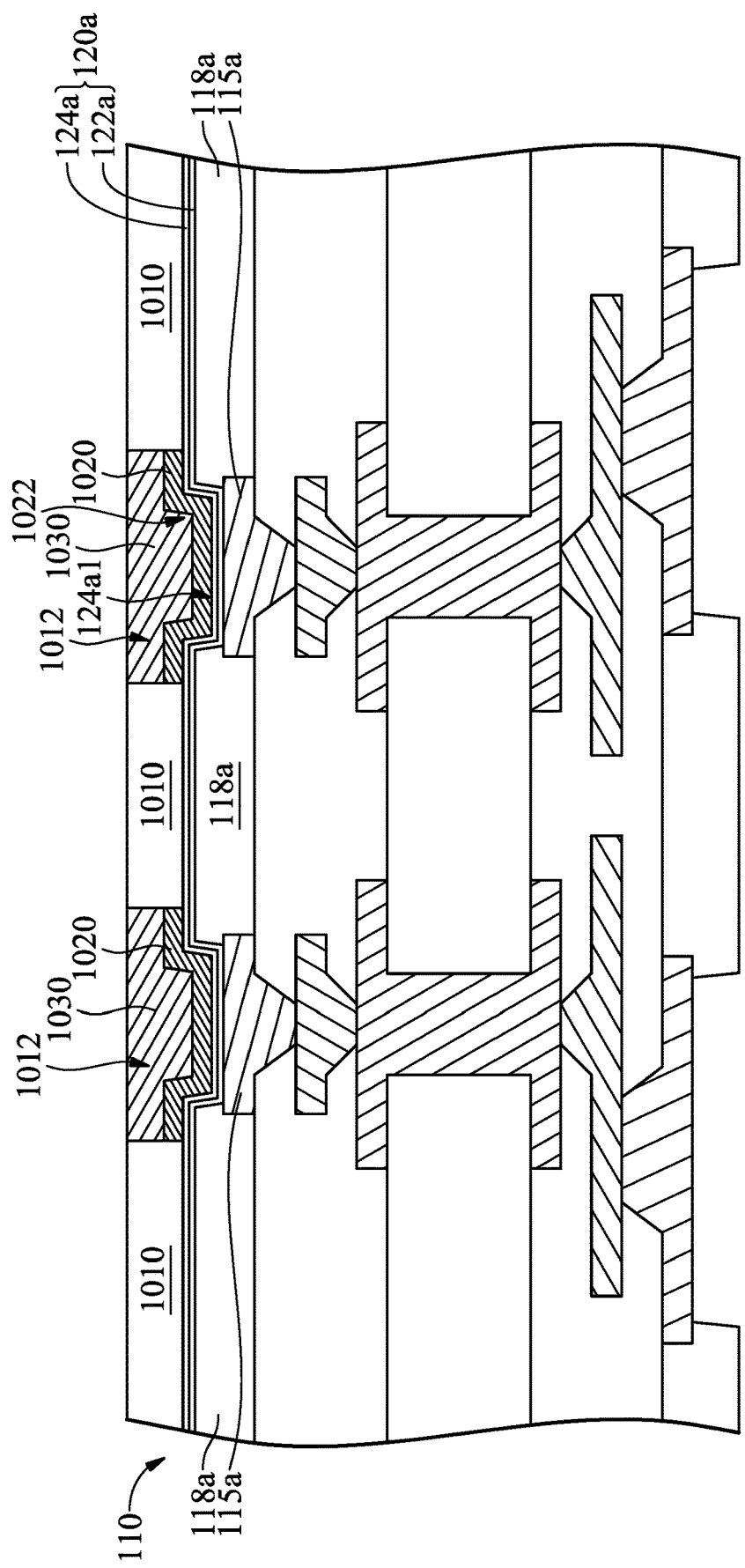
FIGS. 10A-10C are cross-sectional views of various stages of a process for forming a chip package structure, in accordance with some embodiments.
Figure 10B:
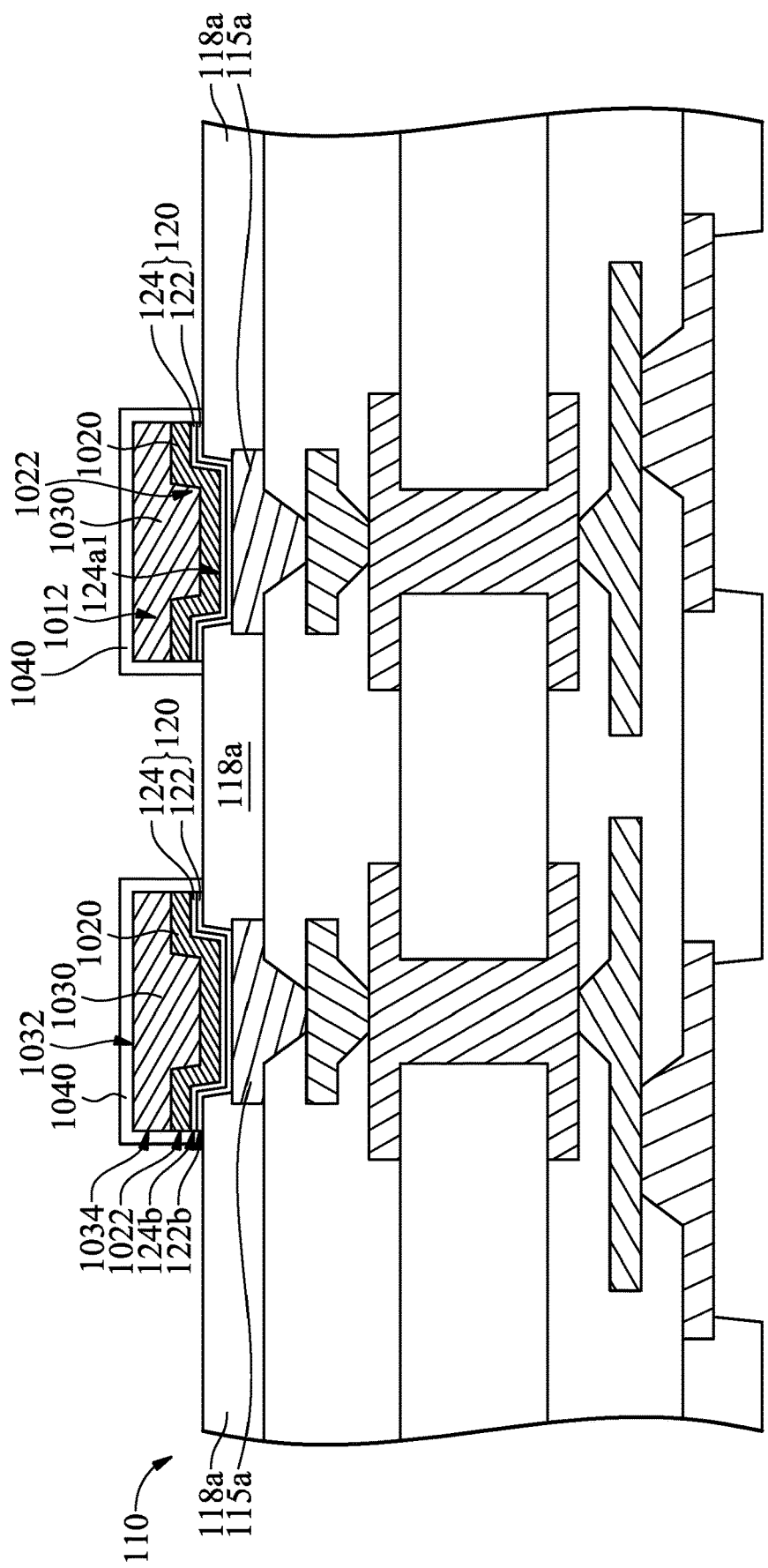
Figure 10C:
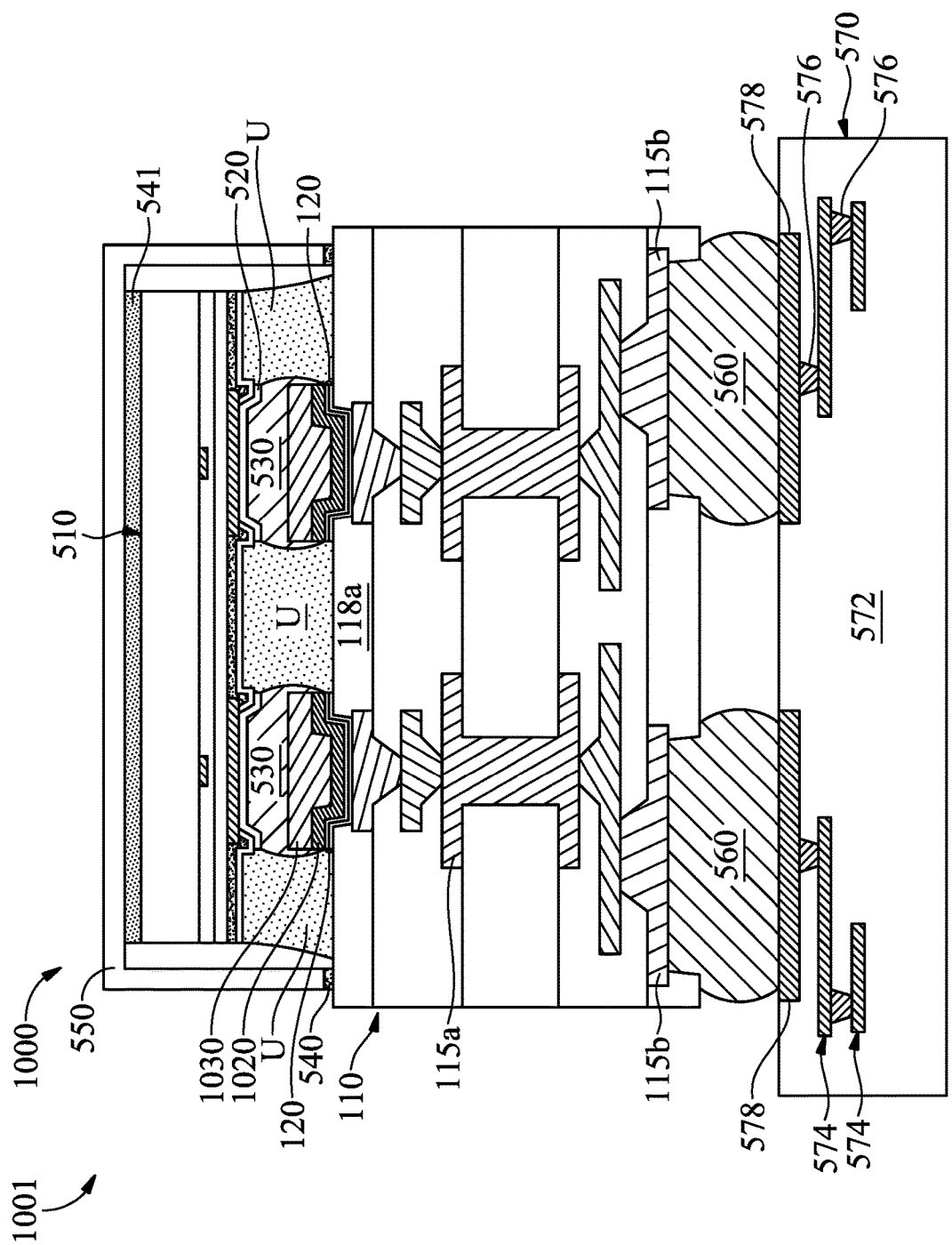

FIGS. 10A-10C are cross-sectional views of various stages of a process for forming a chip package structure, in accordance with some embodiments. As shown in FIG. 10A, after the step of FIG. 8A, a mask layer 1010 is formed over the material layer 124a, in accordance with some embodiments. The mask layer 1010 has openings 1012 exposing the material layer 124a over or adjacent to the pads 115a, in accordance with some embodiments. The mask layer 1010 is made of a photoresist material, such as a polymer material, in accordance with some embodiments.

As shown in FIG. 10A, a nickel layer 1020 is formed in the openings 1012 of the mask layer 1010 and the recesses 124a1 of the material layer 124a, in accordance with some embodiments. The nickel layer 1020 conformally covers the material layer 124a, in accordance with some embodiments. The nickel layer 1020 has recesses 1022 partially in the recesses 124a1, in accordance with some embodiments.

The nickel layer 1020 is thicker than the conductive adhesive material layer 120a, in accordance with some embodiments. The nickel layer 1020 is made of nickel or an alloy thereof, in accordance with some embodiments. The nickel layer 1020 is formed using a plating process such as an electroless plating process, in accordance with some embodiments.

As shown in FIG. 10A, a copper layer 1030 is formed over the nickel layer 1020 and in the recesses 1022, in accordance with some embodiments. The copper layer 1030 is thicker than the nickel layer 1020, in accordance with some embodiments. The recesses 1022 are filled with the copper layer 1030, in accordance with some embodiments. The copper layer 1030 is made of copper or an alloy thereof, in accordance with some embodiments. The copper layer 1030 is formed using a plating process such as an electroless plating process, in accordance with some embodiments.

As shown in FIGS. 10A-10B, the mask layer 1010 and the material layers 122a and 124a under the mask layer 1010 are removed, in accordance with some embodiments.

The material layer 122a remaining under the nickel layer 1020 forms a layer 122, in accordance with some embodiments. The material layer 124a remaining under the nickel layer 1020 forms a layer 124, in accordance with some embodiments. The layers 122 and 124 together form a conductive adhesive layer 120, in accordance with some embodiments.

As shown in FIG. 10B, a cap layer 1040 is formed over the copper layer 1030, the nickel layer 1020, and the conductive adhesive layer 120, in accordance with some embodiments. The cap layer 1040 conformally covers a top surface 1032 and a sidewall 1034 of the copper layer 1030, a sidewall 1022 of the nickel layer 1020, a sidewall 122b of the layer 122, and a sidewall 124b of the layer 124, in accordance with some embodiments. The cap layer 1040 is used to prevent the copper layer 1030, the nickel layer 1020, and the conductive adhesive layer 120 from being oxidized, in accordance with some embodiments.

The cap layer 1040 is made of a material, which is different from that of the copper layer 1030, the nickel layer 1020, and the conductive adhesive layer 120, in accordance with some embodiments. The cap layer 1040 is made of tin or an organic material, in accordance with some embodiments.

The organic material includes an organic solderability preservative (OSP) material, in accordance with some embodiments. The OSP material includes benzotriazole, benzimidazoles, or combinations and derivatives thereof. In some embodiments, the cap layer 1040 is formed by immersing the metal surfaces of the copper layer 1030, the nickel layer 1020, and the conductive adhesive layer 120 in an OSP solution which may contain alkylimidazole, benzotriazole, rosin, rosin esters, or benzimidazole compounds. In some other embodiments, the cap layer 1040 is made of phenylimidazole or other imidazole compounds including 2-arylimidazole as the active ingredient.

As shown in FIGS. 10B-10C, the steps of FIGS. 5A-5B are performed to form the chip 510, the under bump metallurgy layer 520, the conductive bumps 530, the underfill layer U, the adhesive layer 540, and the heat-spreading lid 550 over the wiring substrate 110, in accordance with some embodiments. The conductive bumps 530 are between the copper layer 1030 and the chip 510, in accordance with some embodiments. The cap layer 1040 is dissolved in the conductive bumps 530 after bonding the chip 510 to the wiring substrate 110, in accordance with some embodiments.

As shown in FIG. 10C, the step of FIG. 5C is performed to form conductive bumps 560 over the pads 115b and form chip package structures 1000, in accordance with some embodiments. For the sake of simplicity, FIG. 10C only shows one of the chip package structures 1000, in accordance with some embodiments.

As shown in FIG. 10C, the step of FIG. 5D is performed to bond the wiring substrate 110 to a wiring substrate 570 through the conductive bumps 560, in accordance with some embodiments. The conductive bumps 560 are between the pads 115b of the wiring substrate 110 and the pads 578 of the wiring substrate 570, in accordance with some embodiments.

In this step, a chip package structure (or board-level package structure) 1001 is substantially formed, in accordance with some embodiments. The chip package structure 1001 includes the chip package structure 1000, the conductive bumps 560, and the wiring substrate 570, in accordance with some embodiments. The chip package structure 1001 is a ball grid array (BGA) package structure, in accordance with some embodiments.

Figure 11A:
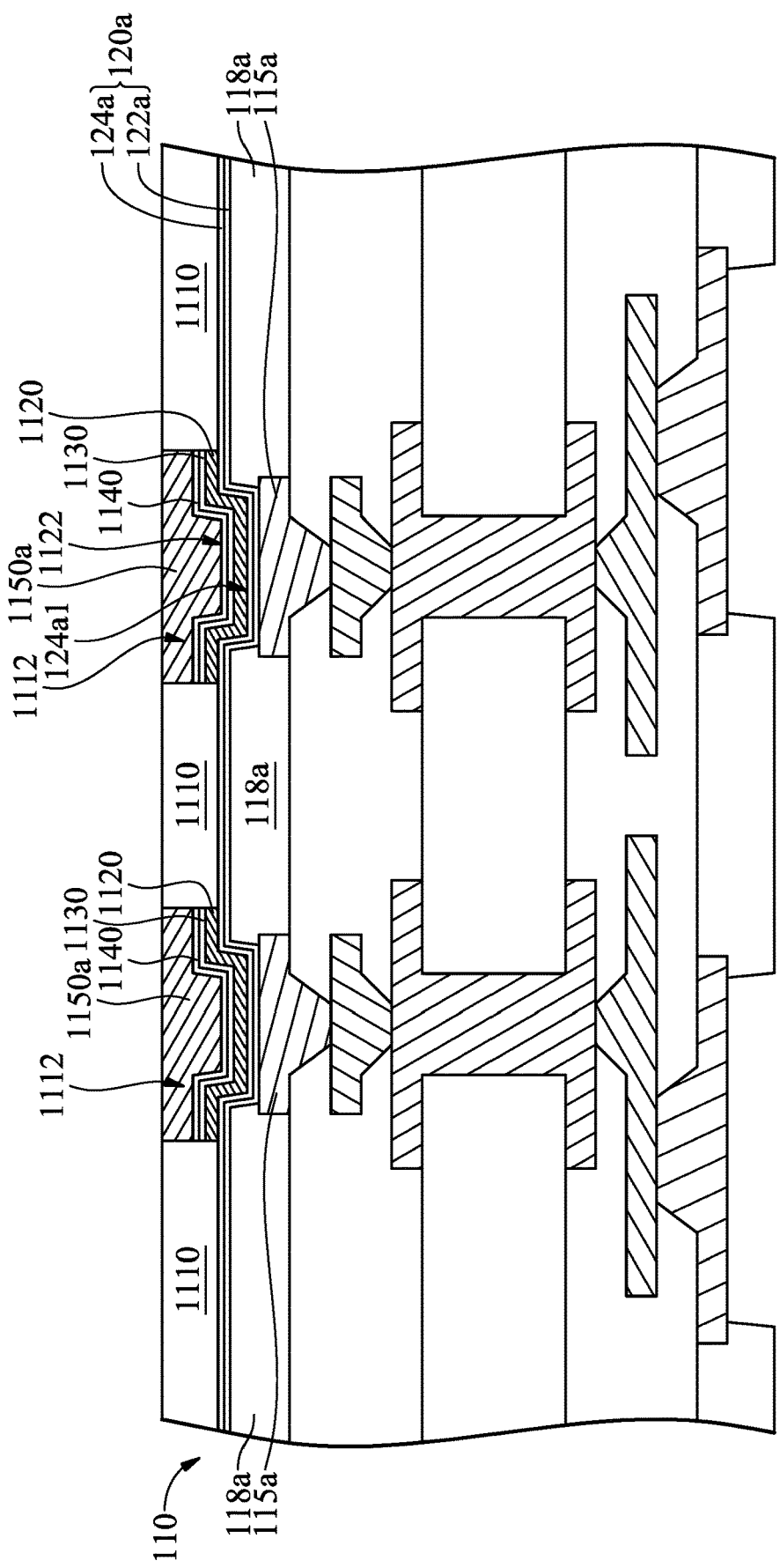
FIGS. 11A-11C are cross-sectional views of various stages of a process for forming a chip package structure, in accordance with some embodiments.
Figure 11B:
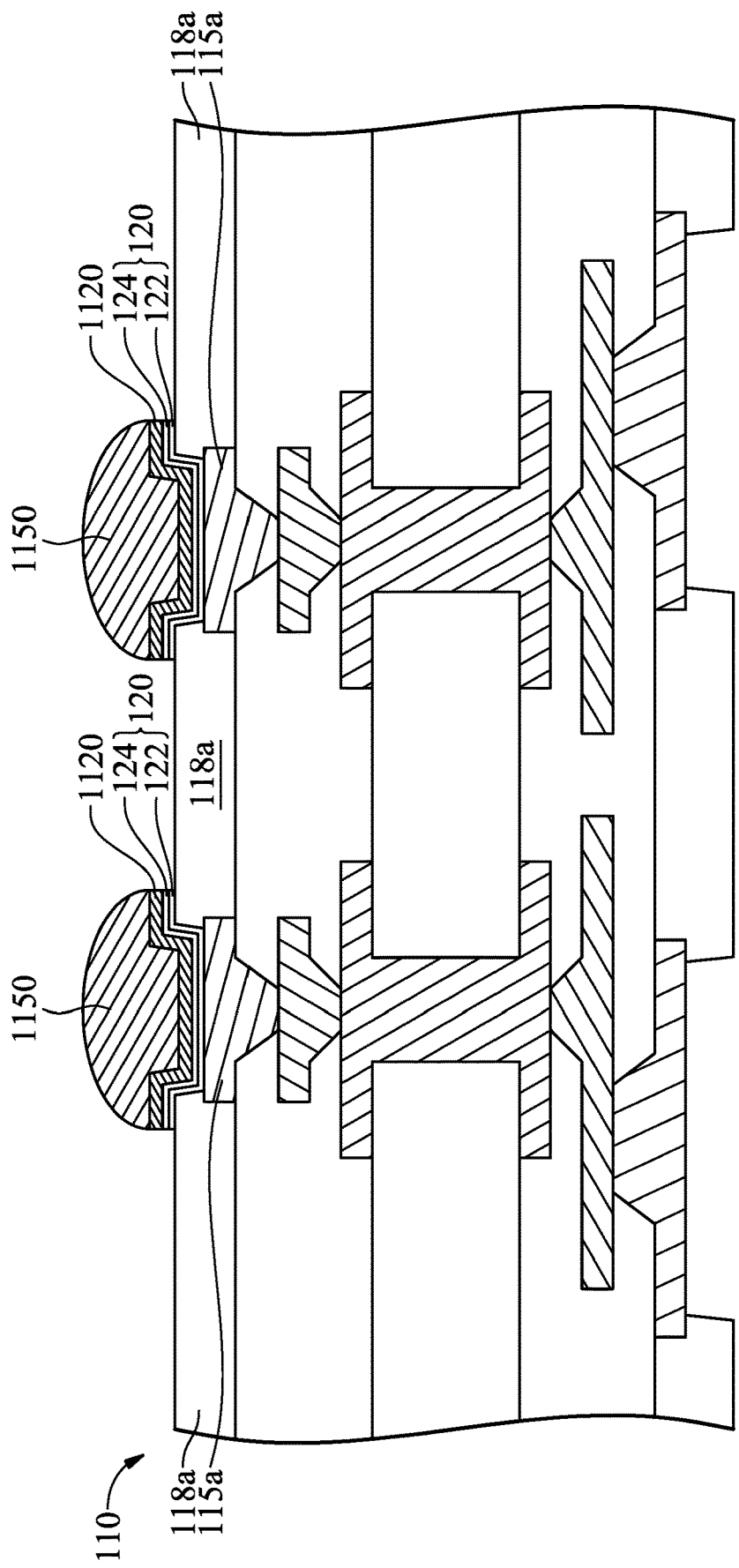
Figure 11C:
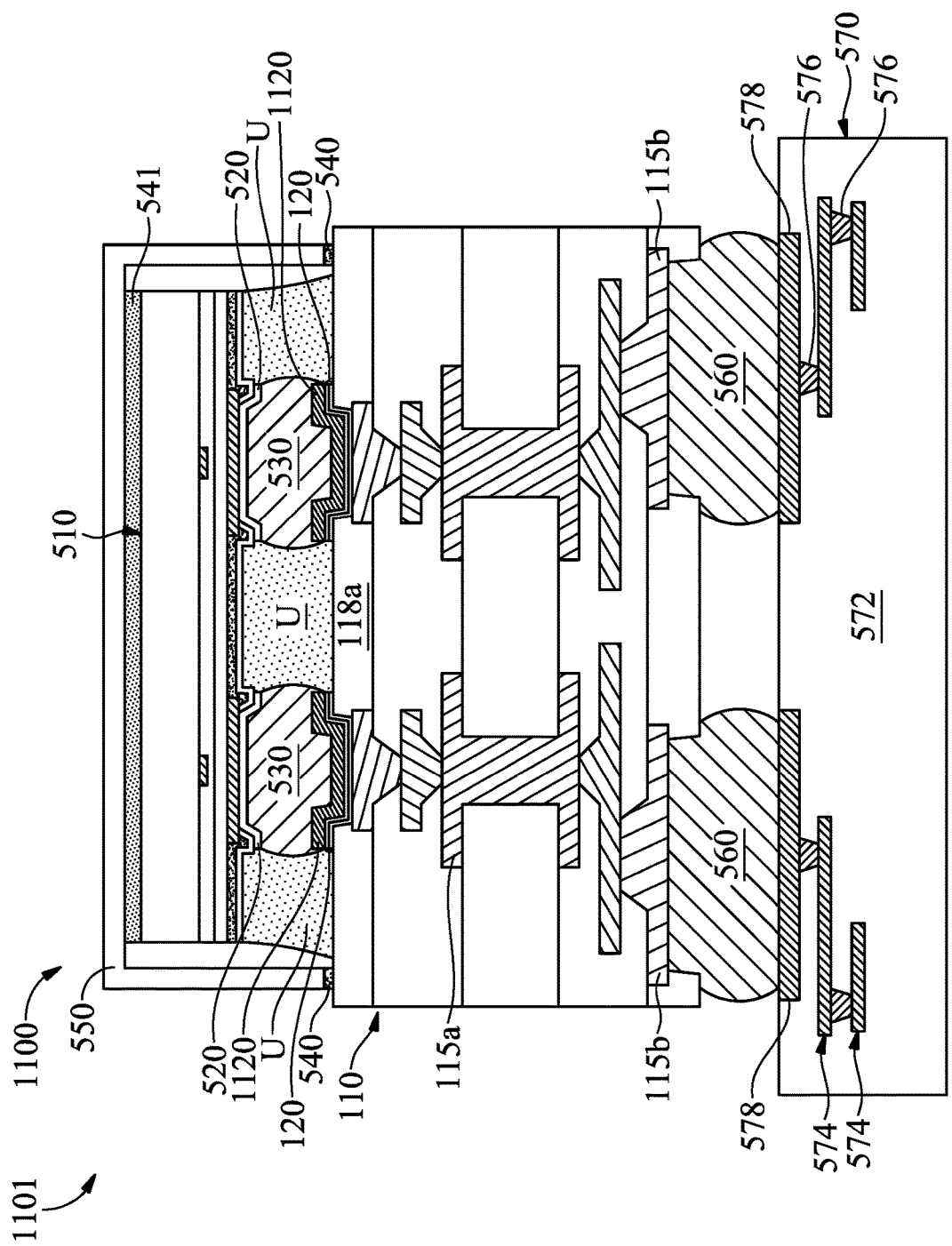

FIGS. 11A-11C are cross-sectional views of various stages of a process for forming a chip package structure, in accordance with some embodiments. As shown in FIG. 11A, after the step of FIG. 8A, a mask layer 1110 is formed over the material layer 124a, in accordance with some embodiments. The mask layer 1110 has openings 1112 exposing the material layer 124a over or adjacent to the pads 115a, in accordance with some embodiments. The mask layer 1110 is made of a photoresist material, such as a polymer material, in accordance with some embodiments.

As shown in FIG. 11A, a nickel layer 1120 is formed in the openings 1112 of the mask layer 1110 and the recesses 124a1 of the material layer 124a, in accordance with some embodiments. The nickel layer 1120 conformally covers the material layer 124a, in accordance with some embodiments. The nickel layer 1120 has recesses 1122 partially in the recesses 124a1, in accordance with some embodiments.

The nickel layer 1120 is thicker than the conductive adhesive material layer 120a, in accordance with some embodiments. The nickel layer 1120 is made of nickel or an alloy thereof, in accordance with some embodiments. The nickel layer 1120 is formed using a plating process such as an electroless plating process, in accordance with some embodiments.

As shown in FIG. 11A, a palladium layer 1130 is formed over the nickel layer 1120, in accordance with some embodiments. The palladium layer 1130 is thinner than the nickel layer 1120, in accordance with some embodiments. The palladium layer 1130 is made of palladium or an alloy thereof, in accordance with some embodiments. The palladium layer 1130 is formed using a plating process such as an electroless plating process, in accordance with some embodiments.

As shown in FIG. 11A, a gold layer 1140 is formed over the palladium layer 1130, in accordance with some embodiments. The gold layer 1140 is thinner than the nickel layer 1120, in accordance with some embodiments. The gold layer 1140 is made of gold or an alloy thereof, in accordance with some embodiments. The gold layer 1140 is formed using a plating process such as an immersion plating process, in accordance with some embodiments.

As shown in FIG. 11A, a solder layer 1150a is formed in the openings 1112 and over the gold layer 1140, in accordance with some embodiments. The solder layer 1150a is thicker than the nickel layer 1120, in accordance with some embodiments. The solder layer 1150a is made of tin or an alloy thereof, in accordance with some embodiments. The solder layer 1150a is formed using a plating process such as an electroplating process or an electroless plating process, in accordance with some embodiments.

As shown in FIGS. 11A-11B, the mask layer 1110 and the material layers 122a and 124a under the mask layer 1110 are removed, in accordance with some embodiments. The material layer 122a remaining under the nickel layer 1120 forms a layer 122, in accordance with some embodiments. The material layer 124a remaining under the nickel layer 1120 forms a layer 124, in accordance with some embodiments. The layers 122 and 124 together form a conductive adhesive layer 120, in accordance with some embodiments.

As shown in FIG. 11B, a reflow process is performed over the solder layer 1150a, in accordance with some embodiments. The reflowed solder layer 1150a forms solder balls 1150, in accordance with some embodiments. The gold layer 1140 and the palladium layer 1130 are dissolved in the solder balls 1150. The solder balls 1150 are in direct contact with the nickel layer 1120, in accordance with some embodiments.

As shown in FIGS. 11B-11C, the steps of FIGS. 5A-5B are performed to form the chip 510, the under bump metallurgy layer 520, the conductive bumps 530, the underfill layer U, the adhesive layer 540, and the heat-spreading lid 550 over the wiring substrate 110, in accordance with some embodiments. The conductive bumps 530 are between the nickel layer 1120 and the under bump metallurgy layer 520, in accordance with some embodiments. A portion of the conductive bumps 530 is formed from the solder balls 1150.

As shown in FIG. 11C, the step of FIG. 5C is performed to form conductive bumps 560 over the pads 115b and form chip package structures 1100, in accordance with some embodiments. For the sake of simplicity, FIG. 11C only shows one of the chip package structures 1100, in accordance with some embodiments.

As shown in FIG. 11C, the step of FIG. 5D is performed to bond the wiring substrate 110 to a wiring substrate 570 through the conductive bumps 560, in accordance with some embodiments. The conductive bumps 560 are between the pads 115b of the wiring substrate 110 and the pads 578 of the wiring substrate 570, in accordance with some embodiments.

In this step, a chip package structure (or board-level package structure) 1101 is substantially formed, in accordance with some embodiments. The chip package structure 1101 includes the chip package structure 1100, the conductive bumps 560, and the wiring substrate 570, in accordance with some embodiments. The chip package structure 1101 is a ball grid array (BGA) package structure, in accordance with some embodiments.

Processes and materials for forming the chip package structures 600, 700, 800, 900, 1000 and 1100 may be similar to, or the same as, those for forming the chip package structure 500 described above. Processes and materials for forming the chip package structures 601, 801, 901, 1001 and 1101 may be similar to, or the same as, those for forming the chip package structure 501 described above. Elements designated by the same reference numbers as those in FIGS. 1A to 11C have the structures and the materials similar thereto or the same thereas. Therefore, the detailed descriptions thereof will not be repeated herein.

In accordance with some embodiments, chip package structures and methods for forming the same are provided. The methods (for forming the chip package structure) form a conductive adhesive layer between a wiring substrate and a conductive bump to improve the adhesion between the conductive bump and a polymer layer of the wiring substrate and between the conductive bump and a pad of the wiring substrate. The methods form a nickel layer between the conductive adhesive layer and the conductive bump. The nickel layer prevents materials of the pad from migrating into the conductive bump during high current density operations. Therefore, the nickel layer reduces electromigration issues.

In accordance with some embodiments, a chip package structure is provided. The chip package structure includes a wiring substrate including a substrate, a first pad, and a second pad. The first pad and the second pad are respectively over a first surface and a second surface of the substrate, and the first pad is narrower than the second pad. The chip package structure includes a nickel layer over the first pad. The nickel layer has a T-shape in a cross-sectional view of the nickel layer. The chip package structure includes a chip over the wiring substrate. The chip package structure includes a conductive bump between the nickel layer and the chip.

In accordance with some embodiments, a chip package structure is provided. The chip package structure includes a wiring substrate including a substrate, a first pad, and a second pad. The first pad and the second pad are respectively over a first surface and a second surface of the substrate, and the first pad is narrower than the second pad. The chip package structure includes a nickel layer over the first pad. The nickel layer has a central portion, a peripheral portion, and a connecting portion connected between the central portion and the peripheral portion, the connecting portion is thinner than the peripheral portion, and the peripheral portion is thinner than the central portion. The chip package structure includes a chip over the wiring substrate. The chip package structure includes a conductive bump bonded between the nickel layer and the chip.

In accordance with some embodiments, a chip package structure is provided. The chip package structure includes a wiring substrate including a substrate, a first pad, a second pad, and a polymer layer. The first pad and the second pad are respectively over a first surface and a second surface of the substrate, the first pad is narrower than the second pad, and the polymer layer is over the first surface and the first pad. The chip package structure includes a nickel layer over the first pad. The nickel layer has a central portion, a peripheral portion, and a connecting portion connected between the central portion and the peripheral portion, the connecting portion is thinner than the peripheral portion and the central portion, the peripheral portion is in direct contact with the polymer layer, and the connecting portion and the central portion are spaced apart from the polymer layer. The chip package structure includes a chip over the wiring substrate. The chip package structure includes a conductive bump between the nickel layer and the chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
    a wiring substrate comprising a substrate, a first pad, and a second pad, wherein the first pad and the second pad are respectively over a first surface and a second surface of the substrate, and the first pad is narrower than the second pad;

a nickel layer over the first pad, wherein the nickel layer has a T-shape in a cross-sectional view of the nickel layer;

a chip over the wiring substrate;

a conductive bump between the nickel layer and the chip; and a conductive adhesive layer over the first pad, wherein the nickel layer is over the conductive adhesive layer, the nickel layer has a first lower surface and a bottom surface, the first lower surface is higher than the bottom surface, the conductive adhesive layer has a second lower surface, and the first lower surface is substantially level with the second lower surface.

2. The chip package structure as claimed in claim 1, wherein the conductive adhesive layer is in direct contact with the first pad.

3. The chip package structure as claimed in claim 1, wherein a first sidewall of the nickel layer is misaligned with a second sidewall of the conductive adhesive layer.

4. The chip package structure as claimed in claim 3, wherein the conductive bump covers the first sidewall of the nickel layer.

5. The chip package structure as claimed in claim 4, wherein a portion of the conductive bump covering the first sidewall of the nickel layer has a curved sidewall.

6. The chip package structure as claimed in claim 1, wherein the wiring substrate further comprises a polymer layer over the first surface and the first pad, the conductive adhesive layer passes through the polymer layer, and the conductive adhesive layer is in direct contact with the polymer layer.

7. The chip package structure as claimed in claim 1, wherein the nickel layer is thicker than the conductive adhesive layer.

8. The chip package structure as claimed in claim 1, wherein the nickel layer and the conductive adhesive layer are made of different materials.

9. The chip package structure as claimed in claim 1, wherein the conductive adhesive layer has a first layer and a second layer over the first layer, and the first layer and the second layer are made of different materials.

10. The chip package structure as claimed in claim 9, wherein the first layer comprises copper, titanium, or palladium, and the second layer comprises nickel or copper.

11. A chip package structure, comprising:

a wiring substrate comprising a substrate, a first pad, and a second pad, wherein the first pad and the second pad are respectively over a first surface and a second surface of the substrate, and the first pad is narrower than the second pad;

a nickel layer over the first pad, wherein the nickel layer has a central portion, a peripheral portion, and a connecting portion connected between the central portion and the peripheral portion, the connecting portion is thinner than the peripheral portion, and the peripheral portion is thinner than the central portion;

a chip over the wiring substrate; and a conductive bump bonded between the nickel layer and the chip.

12. The chip package structure as claimed in claim 11, further comprising:

a conductive adhesive layer over the first pad, wherein a first top portion of the conductive adhesive layer is embedded in the nickel layer.

13. The chip package structure as claimed in claim 12, wherein the first top portion of the conductive adhesive layer is between the central portion and the peripheral portion of the nickel layer.

14. The chip package structure as claimed in claim 13, wherein the central portion is wider than the peripheral portion.

15. The chip package structure as claimed in claim 12, wherein a second top portion of the nickel layer is embedded in the conductive bump.

16. A chip package structure, comprising:

a wiring substrate comprising a substrate, a first pad, a second pad, and a polymer layer, wherein the first pad and the second pad are respectively over a first surface and a second surface of the substrate, the first pad is narrower than the second pad, and the polymer layer is over the first surface and the first pad;

a nickel layer over the first pad, wherein the nickel layer has a central portion, a peripheral portion, and a connecting portion connected between the central portion and the peripheral portion, the connecting portion is thinner than the peripheral portion and the central portion, the peripheral portion is in direct contact with the polymer layer, and the connecting portion and the central portion are spaced apart from the polymer layer;

a chip over the wiring substrate; and a conductive bump between the nickel layer and the chip.

17. The chip package structure as claimed in claim 16, wherein the conductive bump covers a top surface and a sidewall of the nickel layer.

18. The chip package structure as claimed in claim 16, wherein the peripheral portion of the nickel layer is embedded in the conductive bump.

19. The chip package structure as claimed in claim 16, further comprising:

a conductive adhesive layer over the first pad, wherein a lower surface of the conductive adhesive layer and a bottom surface of the peripheral portion of the nickel layer are substantially level with each other.

20. The chip package structure as claimed in claim 1, wherein the nickel layer separates the conductive bump from the conductive adhesive layer.

* * * * *